United States Patent
Landis et al.

(10) Patent No.: US 12,493,145 B2
(45) Date of Patent: Dec. 9, 2025

(54) METHOD FOR MANUFACTURING A MULTISPECTRAL FILTER FOR ELECTROMAGNETIC RADIATION

(71) Applicant: COMMISSARIAT À L'ENERGIE ATOMIQUE ET AUX ENERGIES ALTERNATIVES, Paris (FR)

(72) Inventors: Stefan Landis, Grenoble (FR); Sébastien Berard-Bergery, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 520 days.

(21) Appl. No.: 18/162,901

(22) Filed: Feb. 1, 2023

(65) Prior Publication Data

US 2023/0244019 A1  Aug. 3, 2023

(30) Foreign Application Priority Data

Feb. 1, 2022 (FR) ...................................... 2200868

(51) Int. Cl.
*G02B 5/28* (2006.01)
*G03F 7/00* (2006.01)

(52) U.S. Cl.
CPC ............. *G02B 5/288* (2013.01); *G02B 5/286* (2013.01); *G03F 7/0007* (2013.01)

(58) Field of Classification Search
CPC ....... G02B 5/288; G02B 5/286; G03F 7/0007; H10F 39/024; H10F 39/8053
See application file for complete search history.

(56) References Cited

U.S. PATENT DOCUMENTS

| 6,031,653 A | 2/2000 | Wang |
| 2014/0085727 A1 | 3/2014 | Chen et al. |

(Continued)

FOREIGN PATENT DOCUMENTS

| EP | 2 522 968 A1 | 11/2012 |
| WO | WO 2019/239139 A1 | 12/2019 |

OTHER PUBLICATIONS

Search Report as issued in French Patent Application No. FR2200868, dated Sep. 16, 2022.

*Primary Examiner* — Stewart A Fraser
(74) *Attorney, Agent, or Firm* — Pillsbury Winthrop Shaw Pittman LLP

(57) ABSTRACT

A method for manufacturing a multispectral filter for electromagnetic radiation including two colour filters each including a first reflective layer, a second reflective layer, a layer of dielectric material of Fabry-Perot cavity, the thickness of the dielectric layer of both colour filters being different and each of both filters facing a photoelectric transducer. The method includes depositing a resin layer onto a handle substrate, structuring the resin layer to obtain two resin patterns of different heights, at least one of the patterns having a maximum reference height; depositing a dielectric layer to form the dielectric patterns of the Fabry-Perot cavities and planarising; transferring the planarised face of the handle substrate to the upper face of a carrier substrate; removing the handle substrate and the resin and depositing a reflective layer onto the at least two dielectric patterns of Fabry-Perot cavity, forming the second reflective layer.

11 Claims, 26 Drawing Sheets

(56) References Cited

U.S. PATENT DOCUMENTS

| | | | |
|---|---|---|---|
| 2017/0294478 A1 | 10/2017 | Cui et al. | |
| 2020/0335540 A1* | 10/2020 | Sugizaki | H10F 39/8053 |
| 2021/0231889 A1* | 7/2021 | Heussler | G03F 7/70466 |
| 2021/0255543 A1 | 8/2021 | Williams et al. | |
| 2021/0341657 A1* | 11/2021 | Ishikawa | G01J 3/26 |
| 2022/0003907 A1* | 1/2022 | Borremans | H04N 25/76 |

* cited by examiner

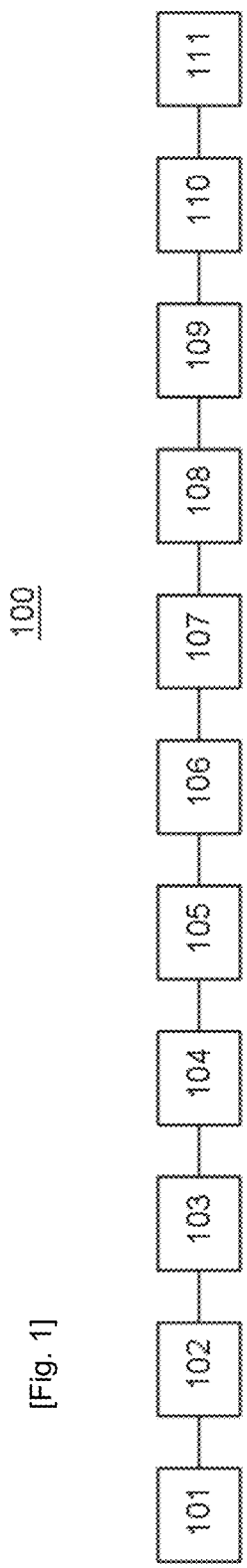

[Fig. 2]
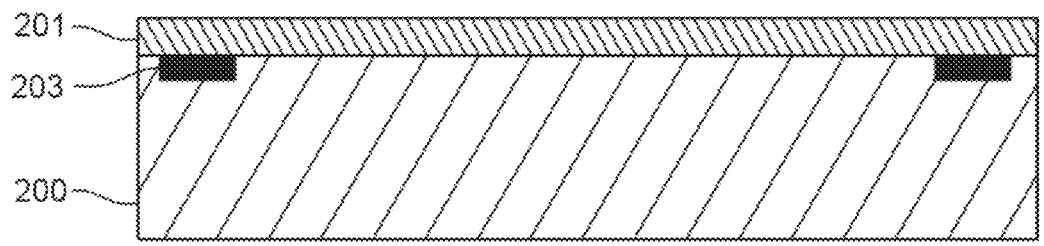
[Fig. 3]
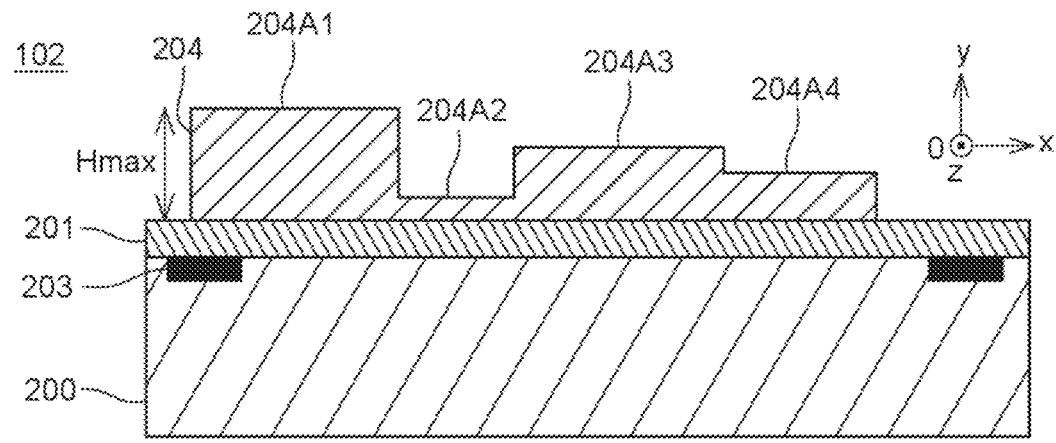
[Fig. 4]
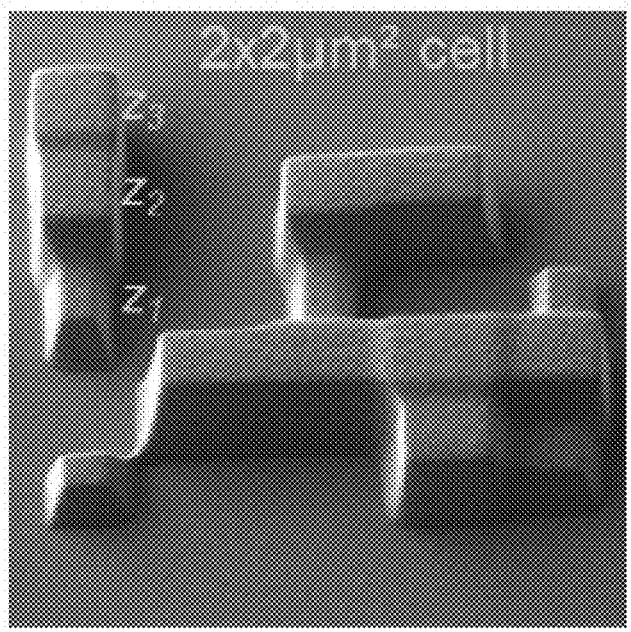

[Fig. 5]
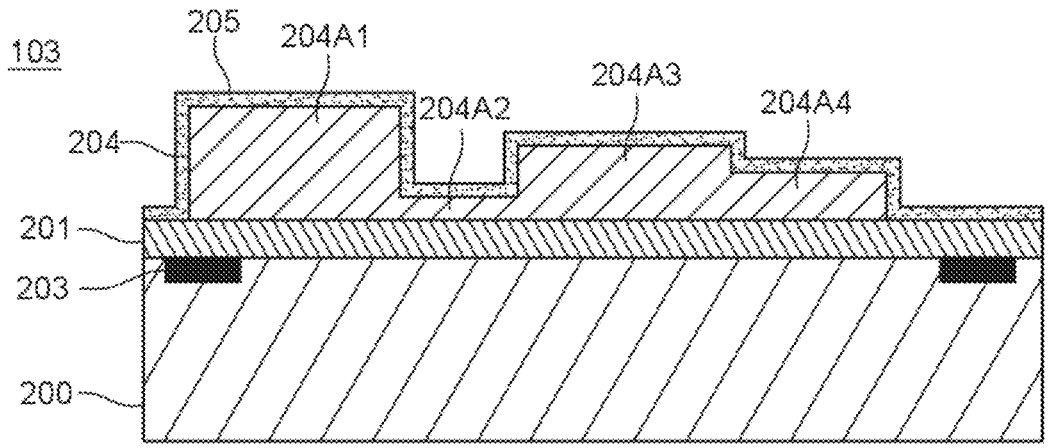
[Fig. 6]
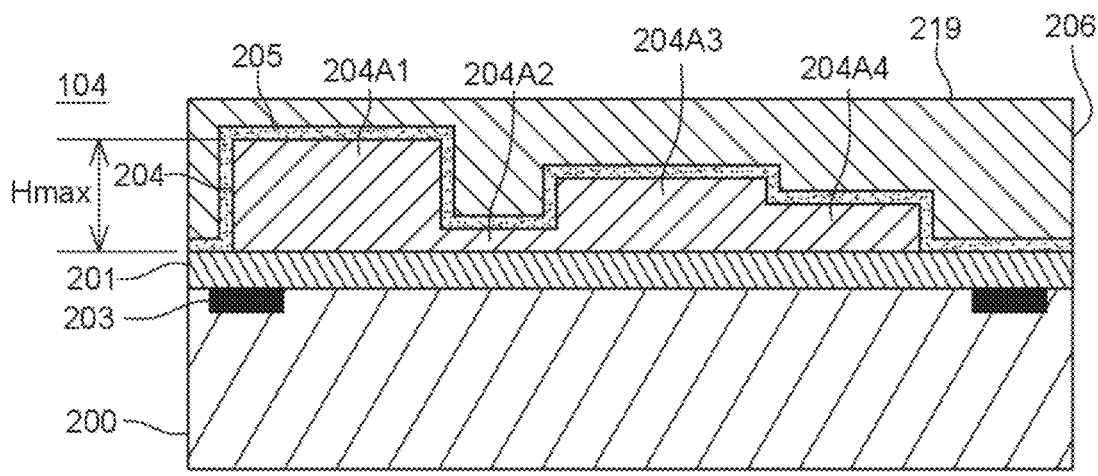
[Fig. 7]
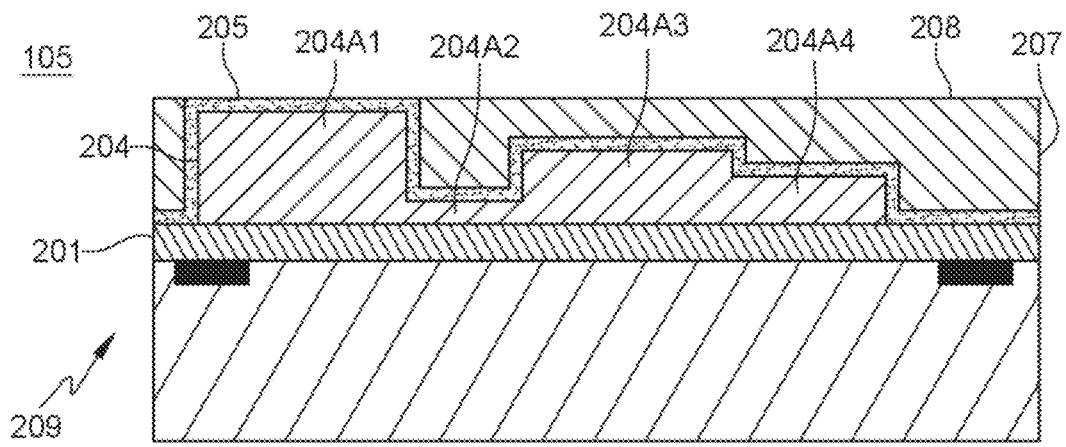

[Fig. 8]
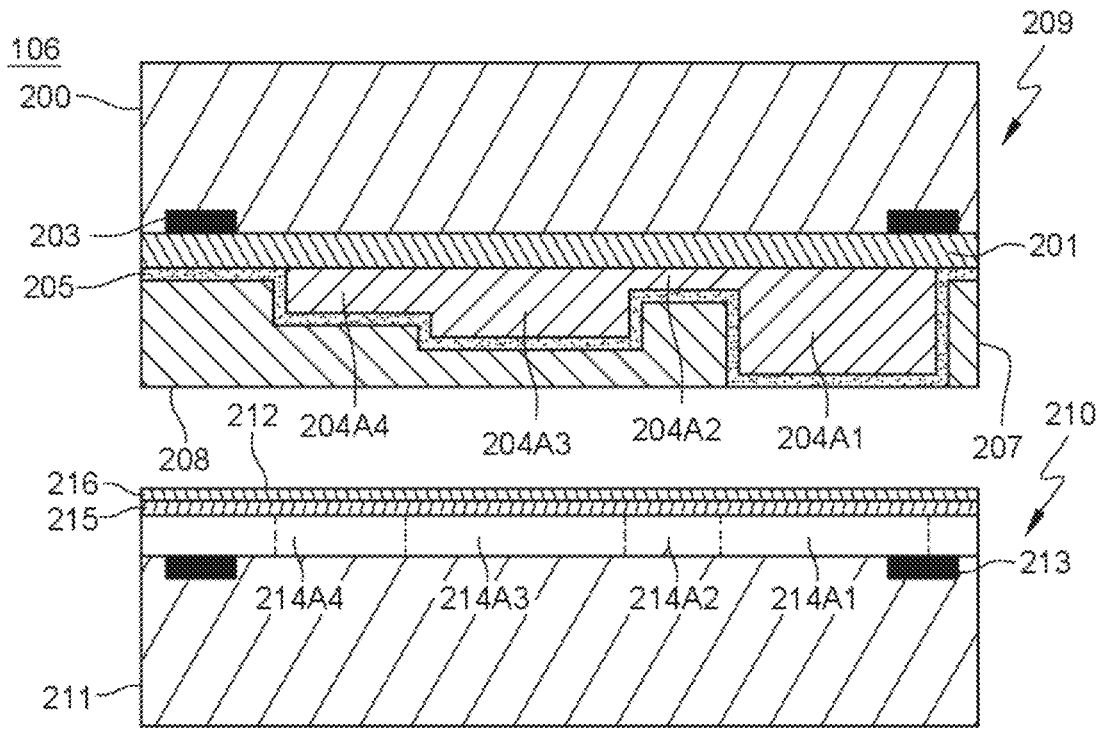
[Fig. 9]
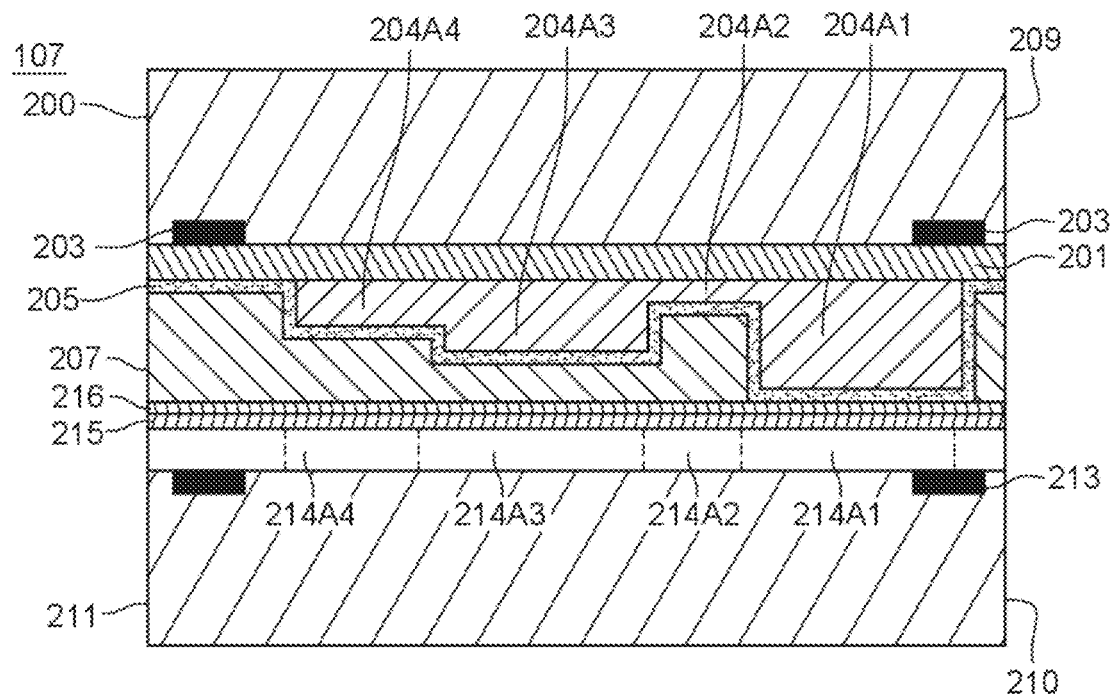

[Fig. 10]
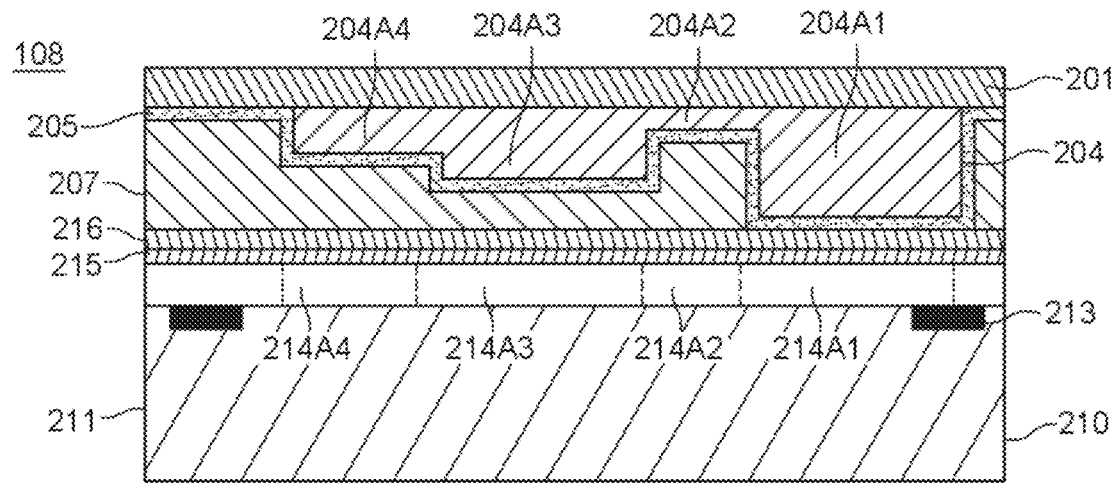
[Fig. 11]
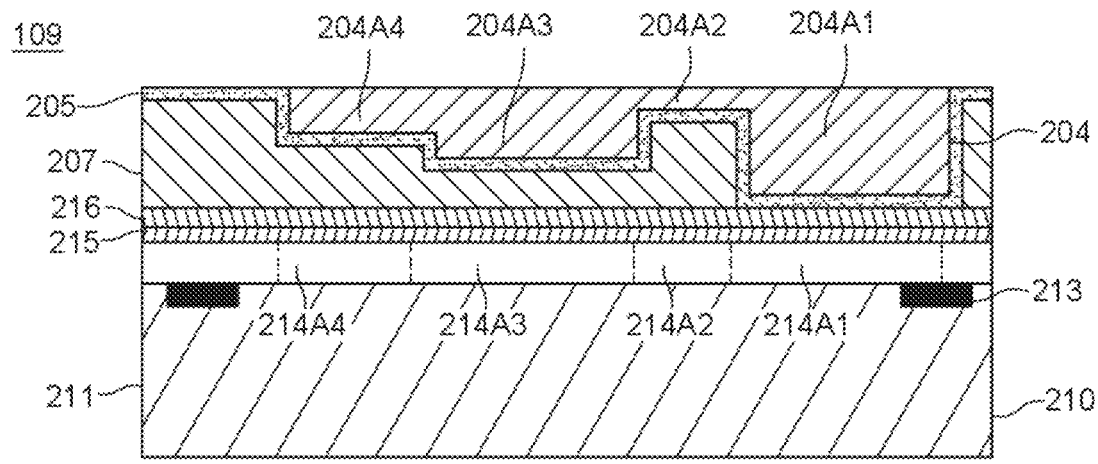
[Fig. 12]
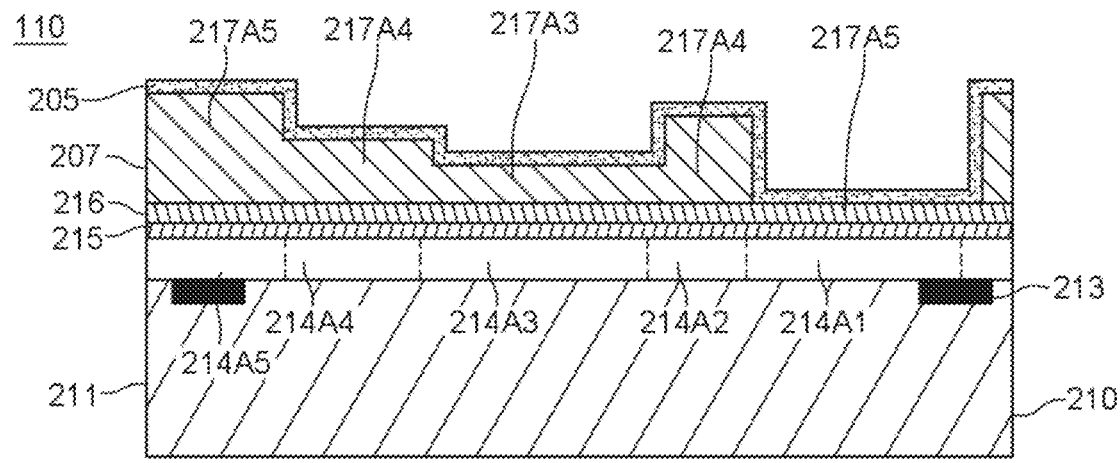

[Fig. 13]
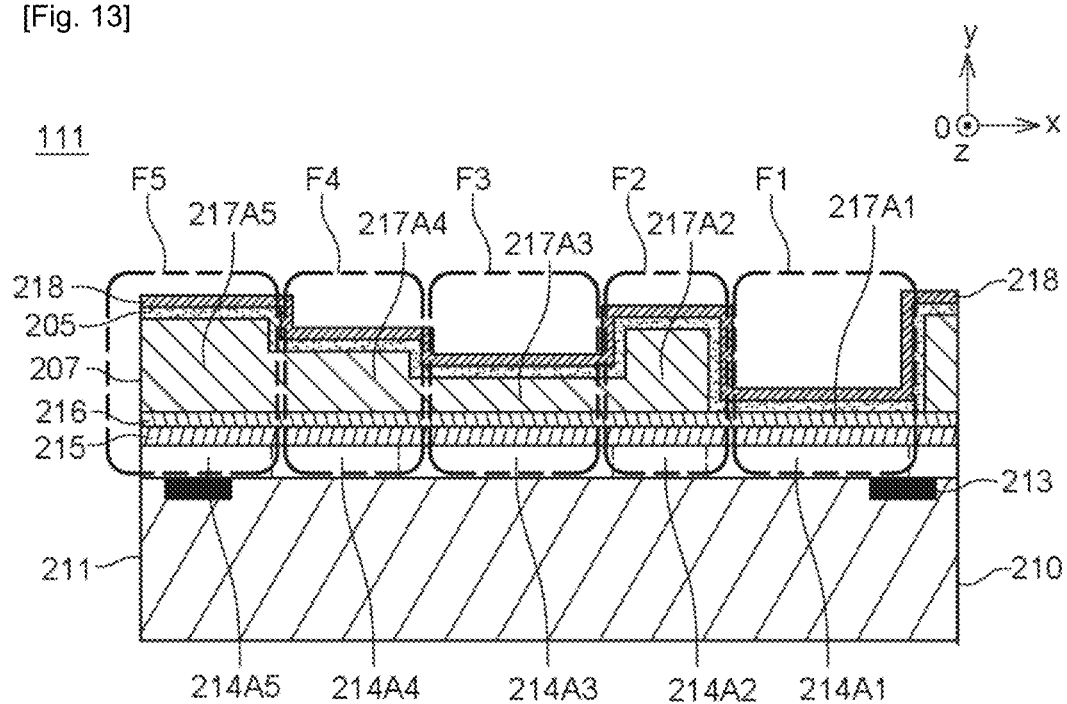

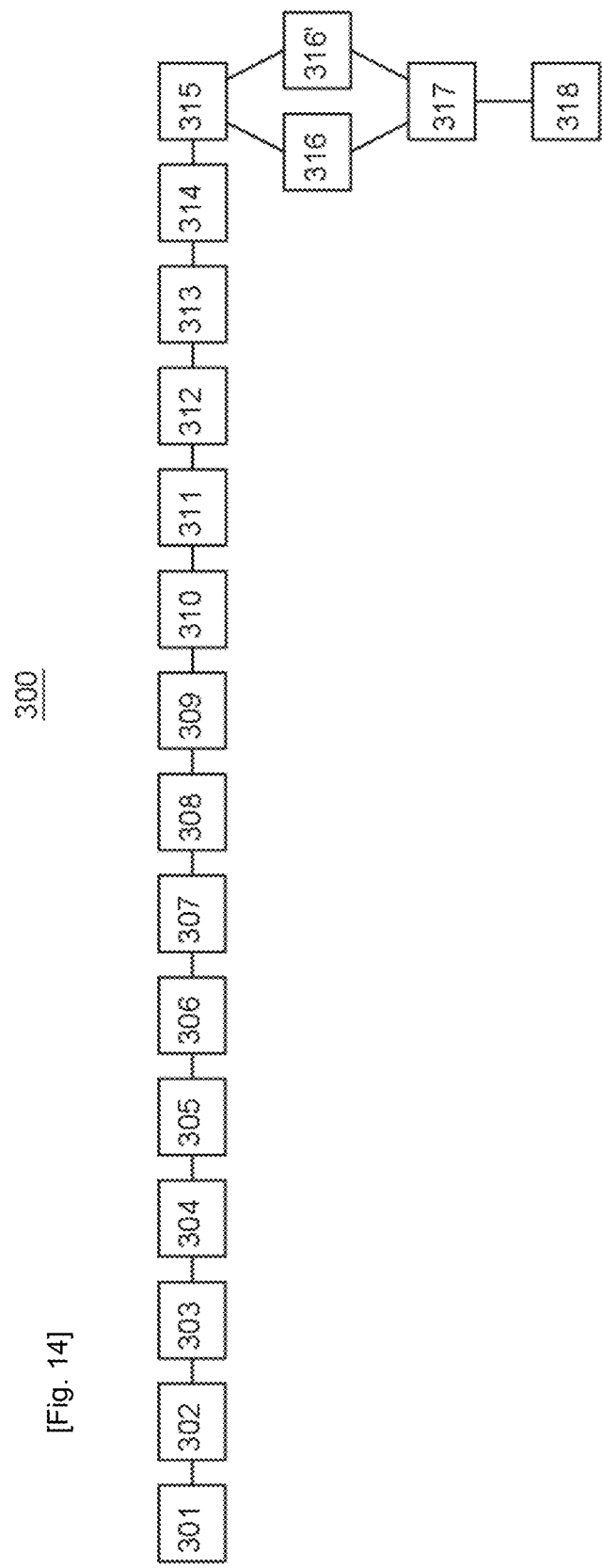
[Fig. 14]

[Fig. 15]
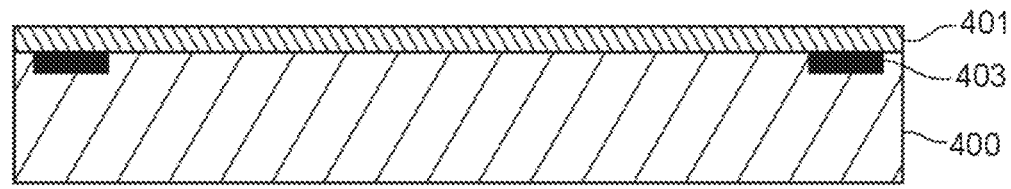
[Fig. 16]
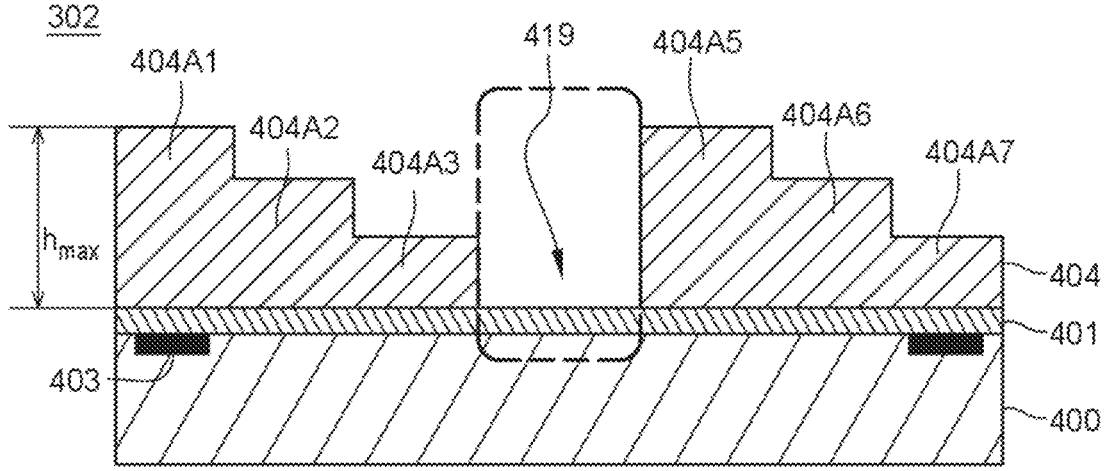
[Fig. 17]
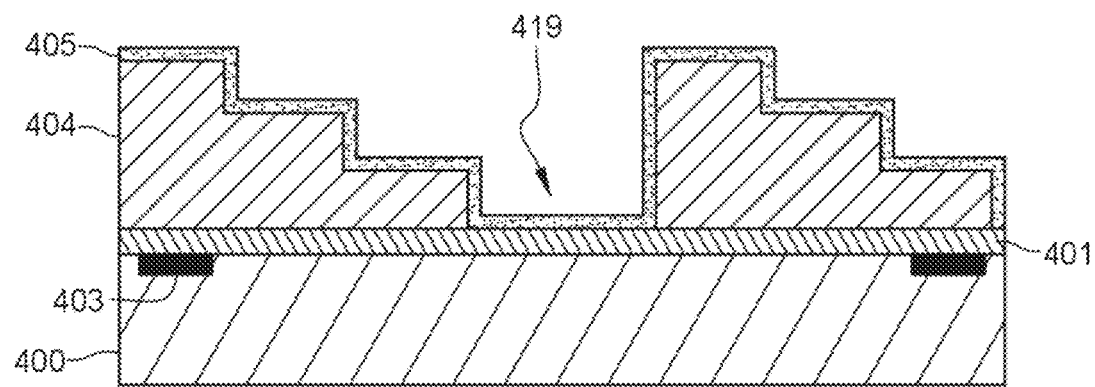

[Fig. 18]
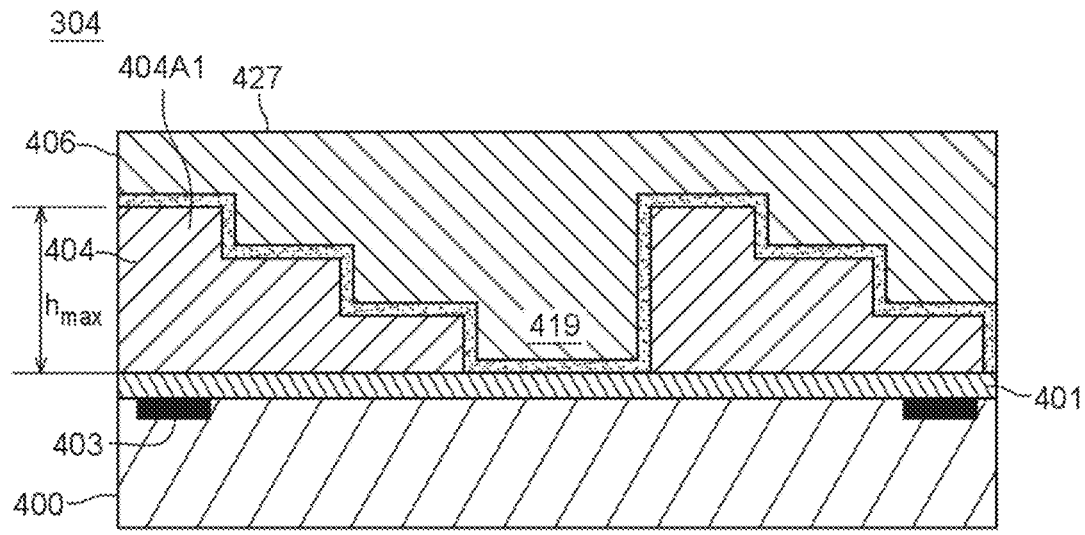
[Fig. 19]
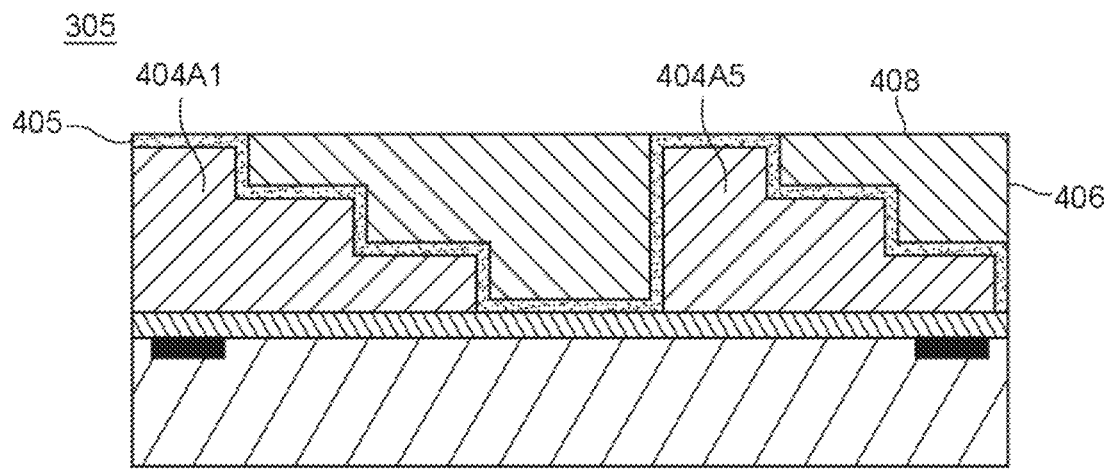

[Fig. 20]
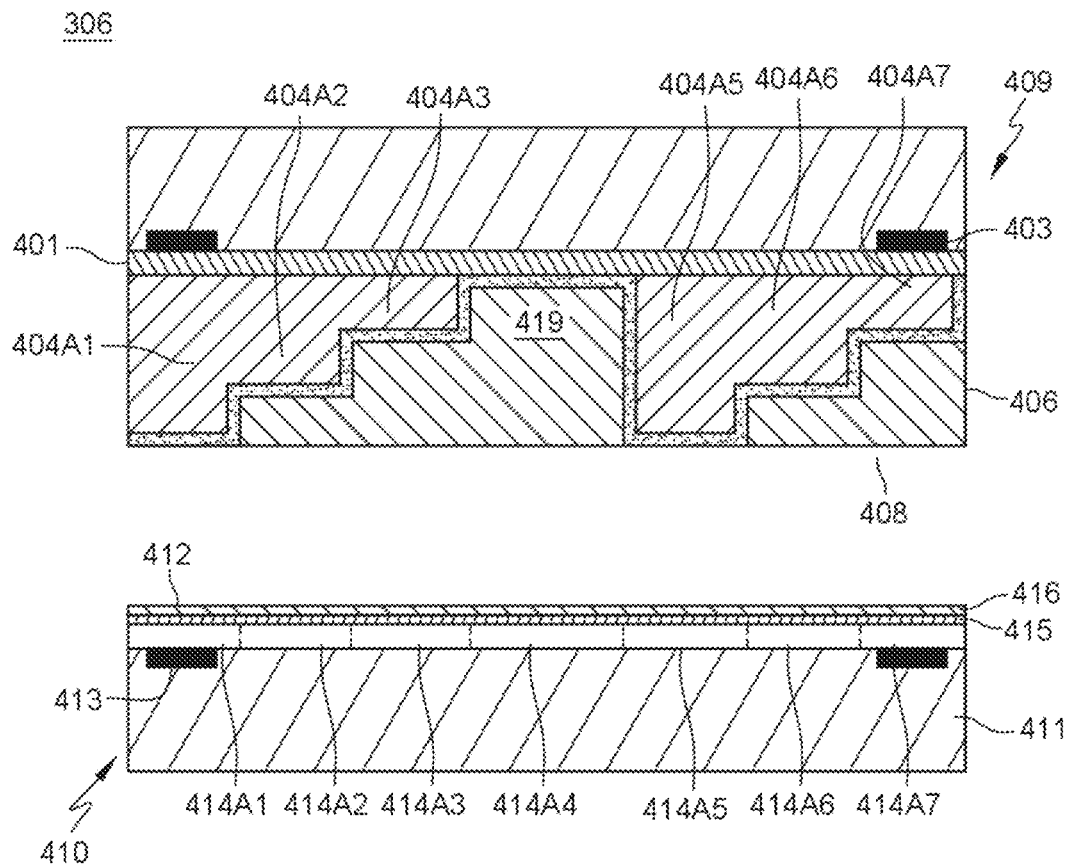
[Fig. 21]
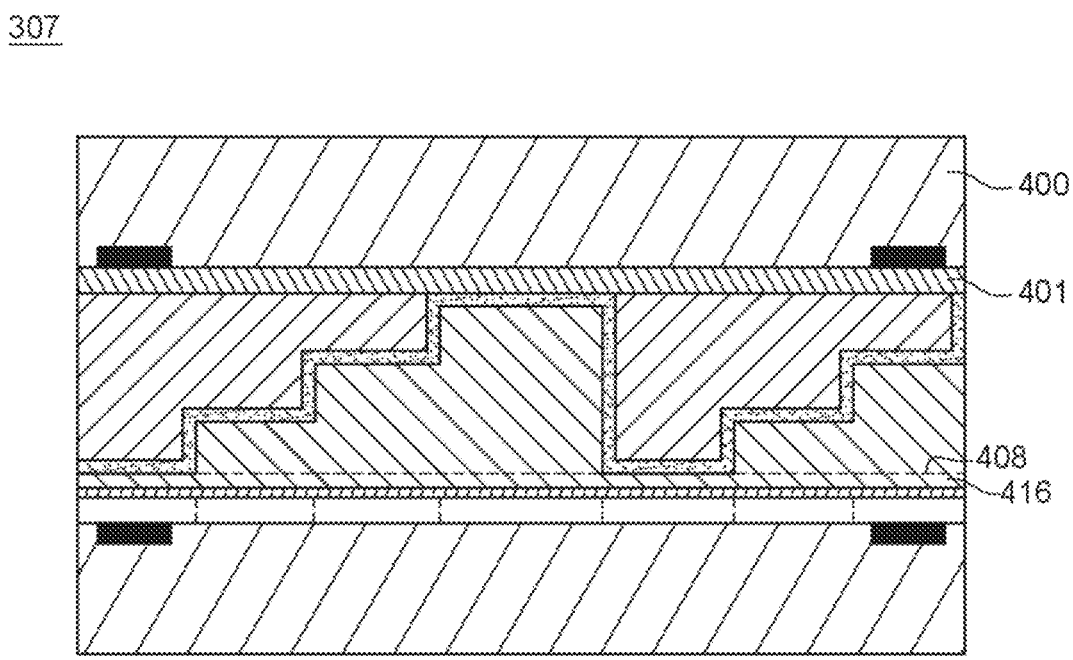

[Fig. 22]
308
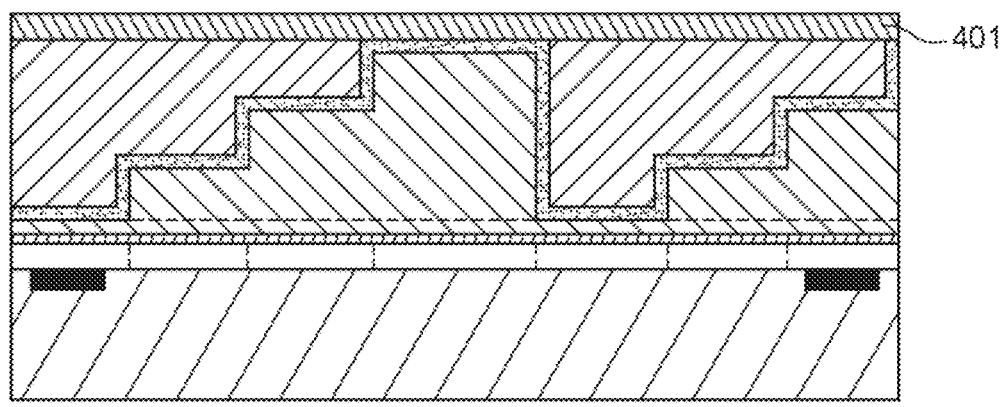
[Fig. 23]
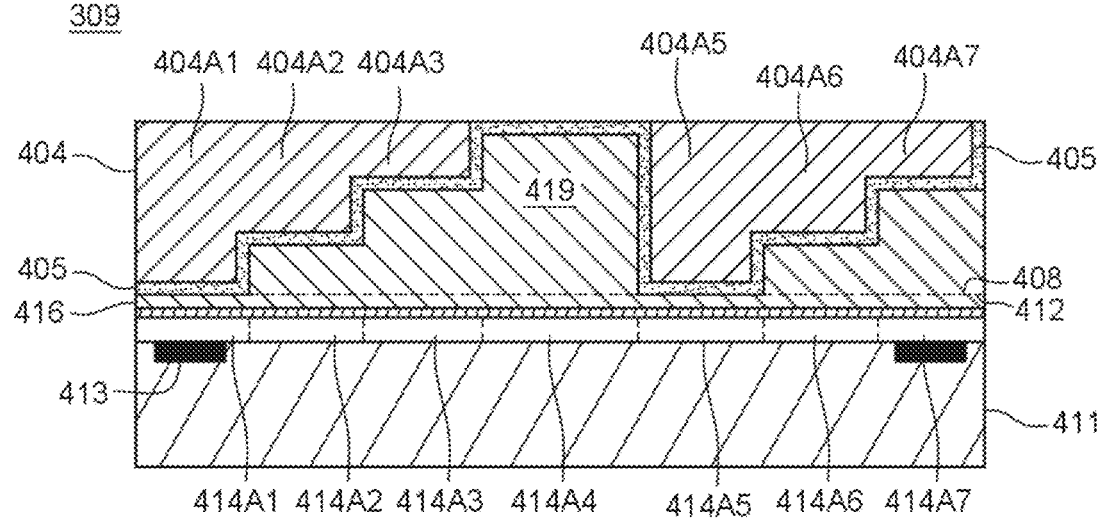

[Fig. 24]
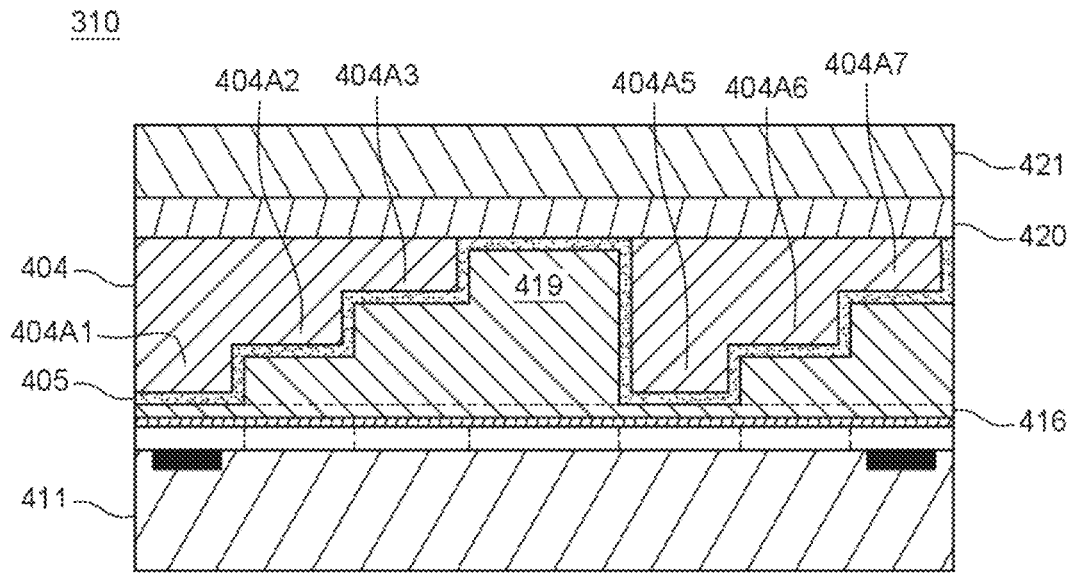
[Fig. 25]
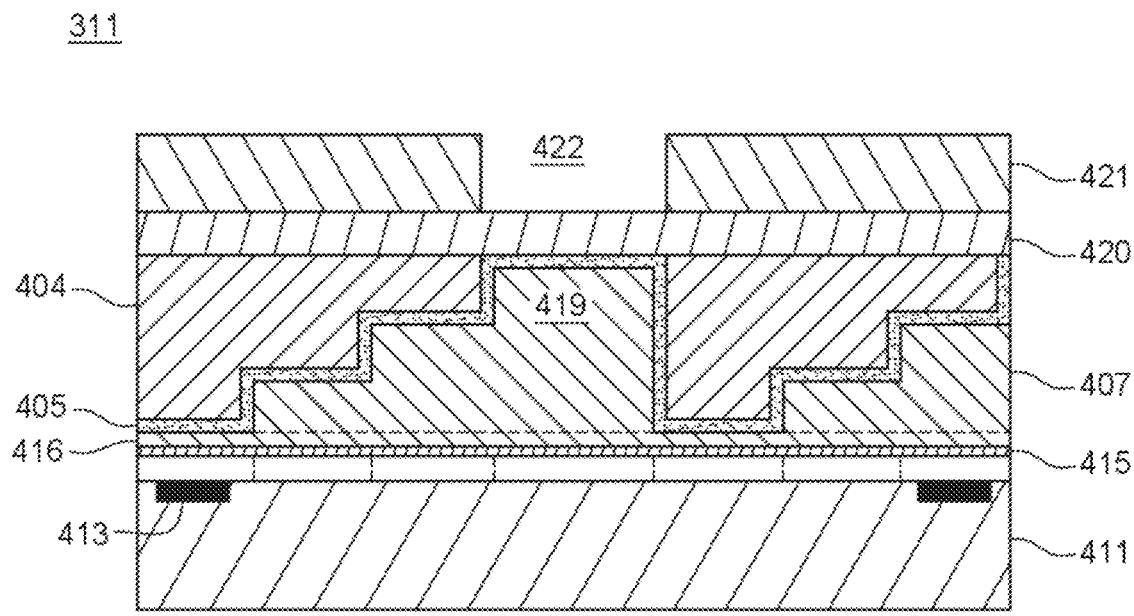

[Fig. 26]
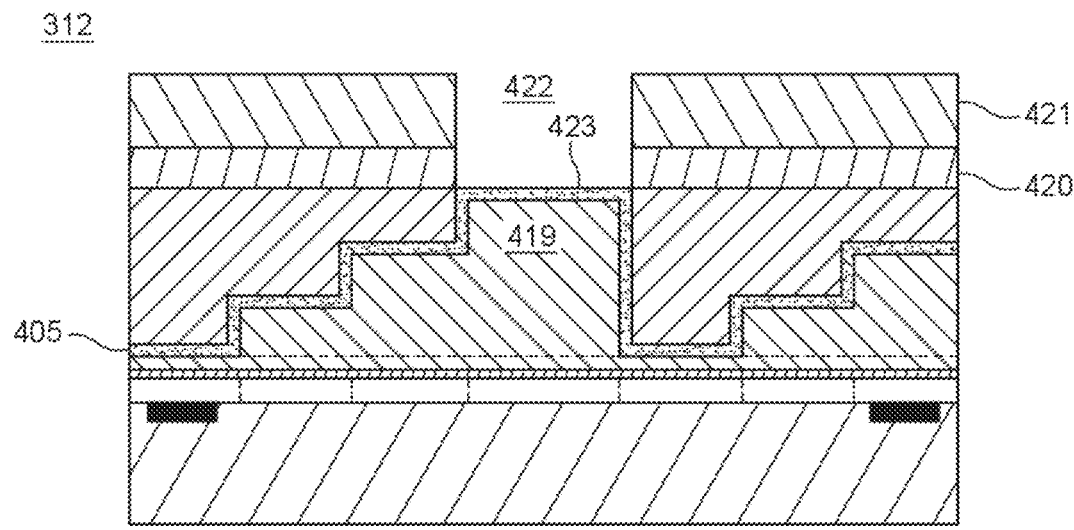
[Fig. 27]
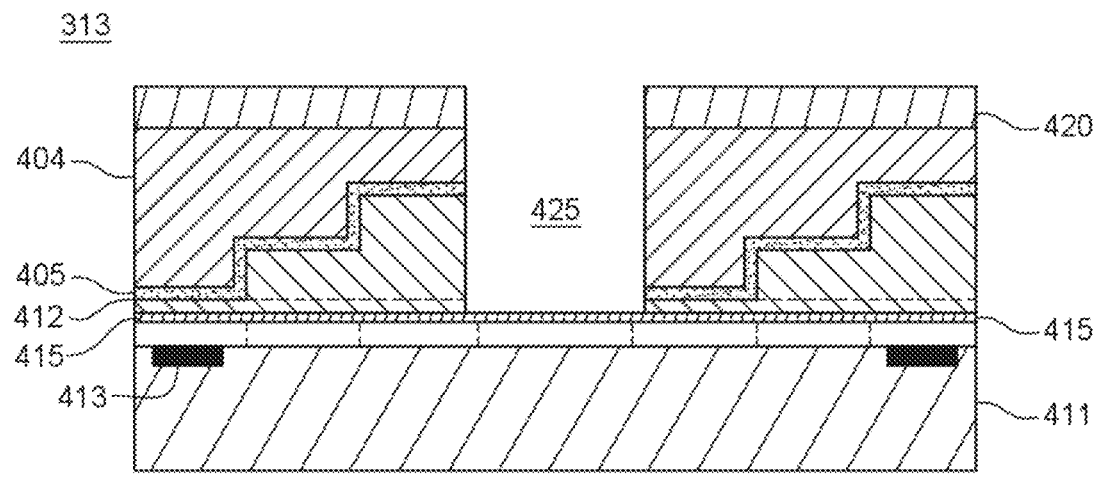

[Fig. 28]
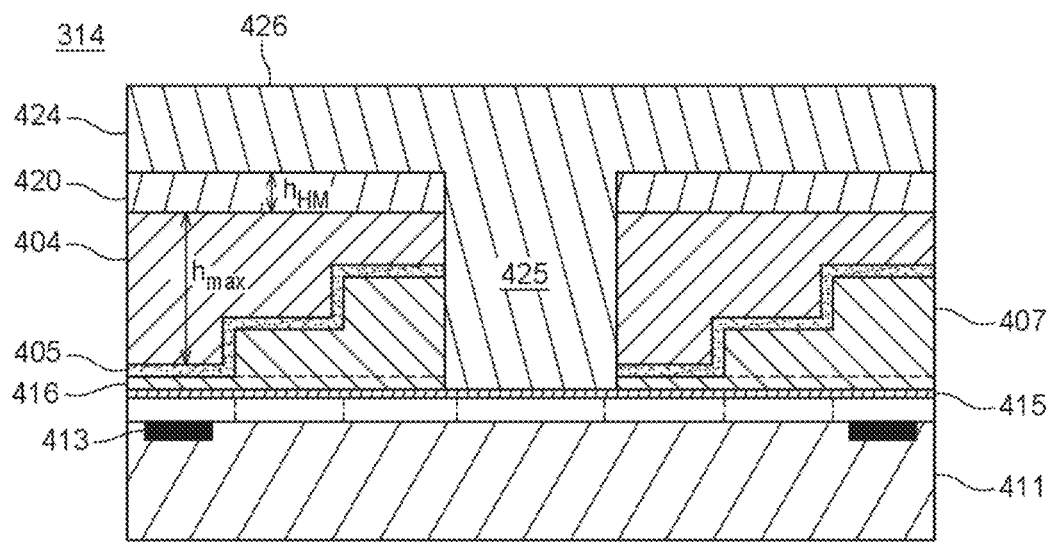
[Fig. 29]
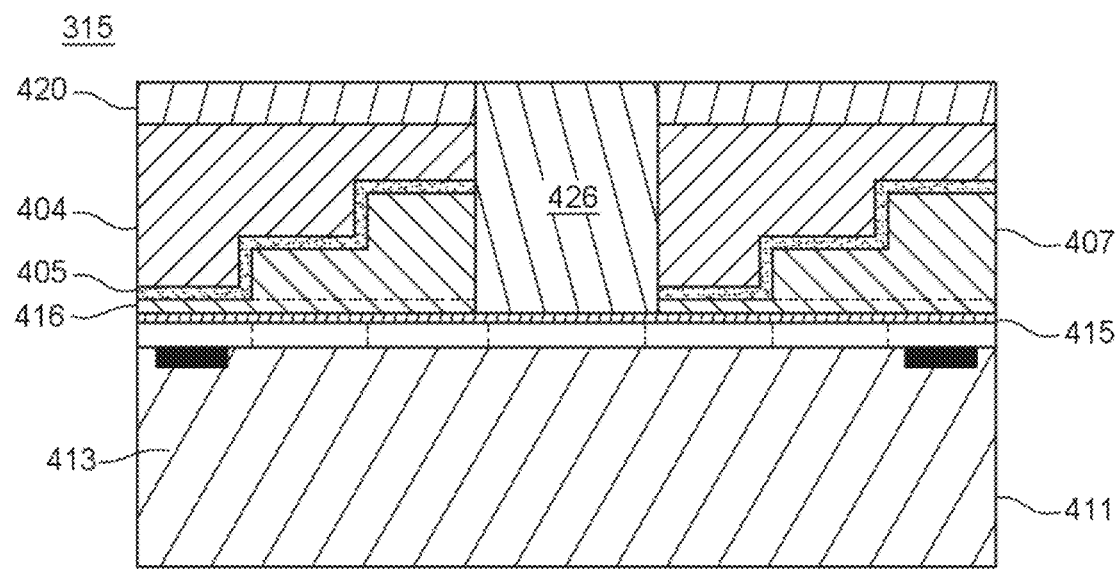

[Fig. 30]
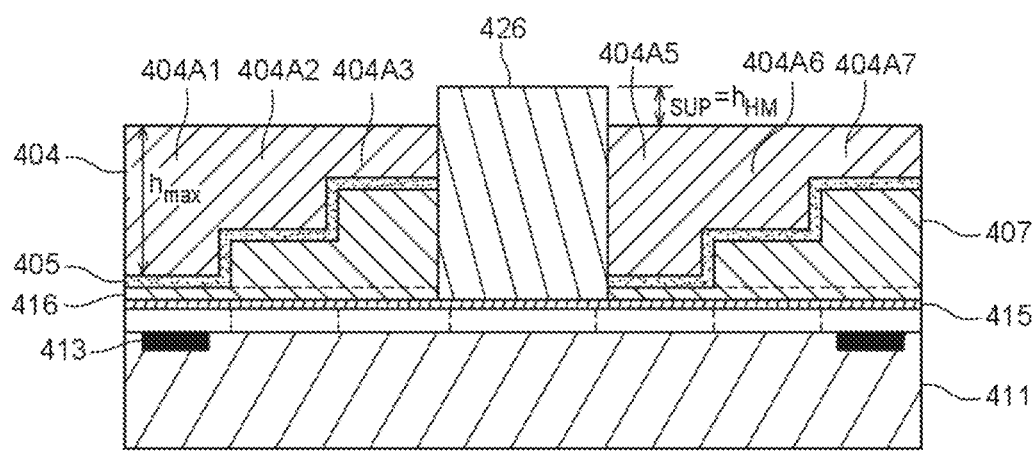
[Fig. 31]
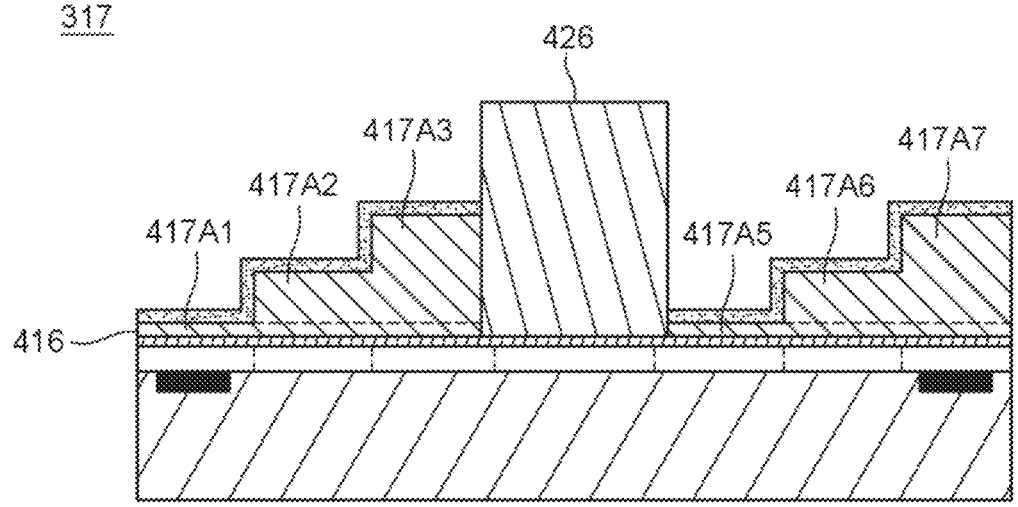

[Fig. 32]
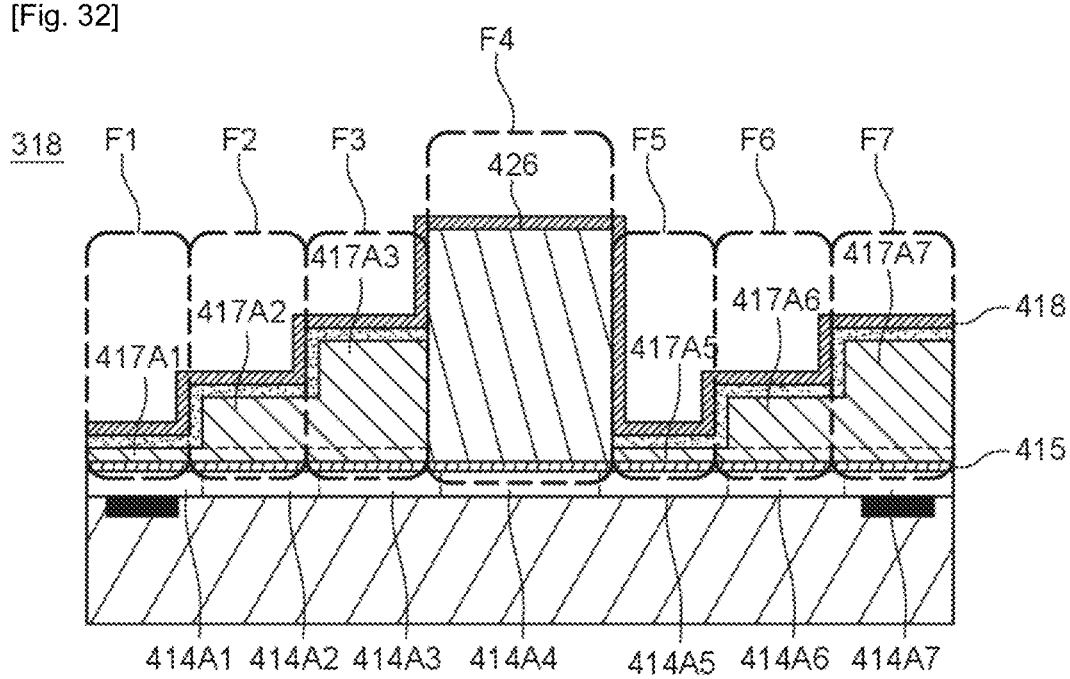
[Fig. 33]
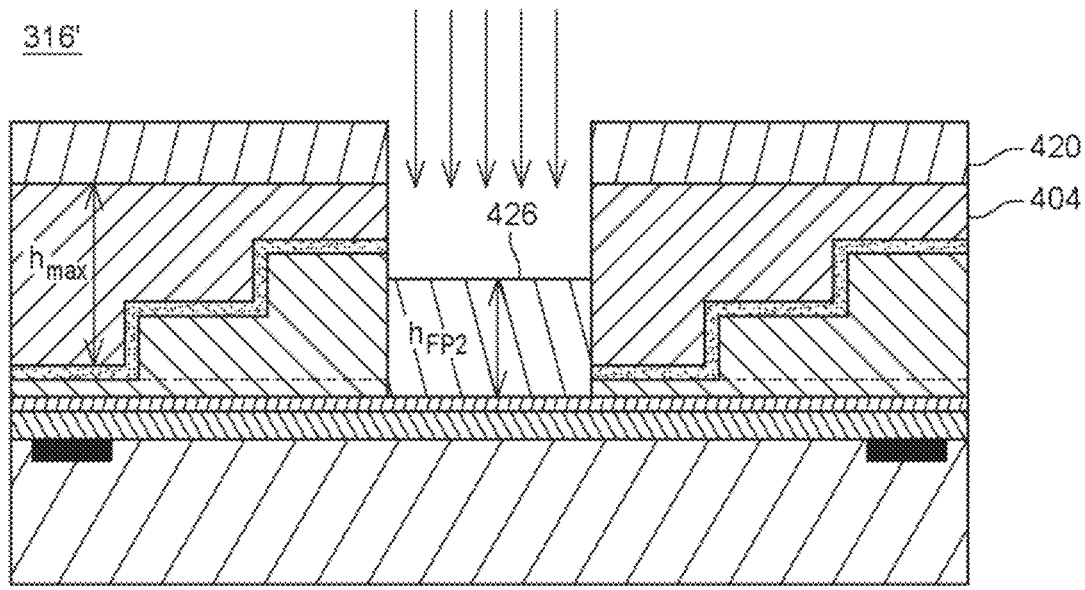

[Fig. 34]
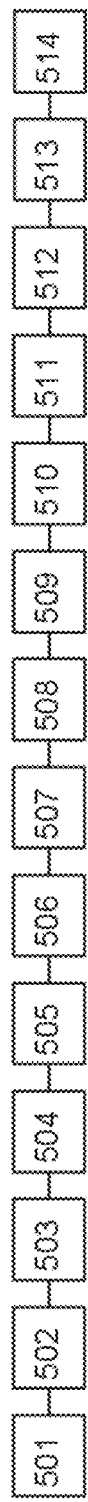

[Fig. 35]
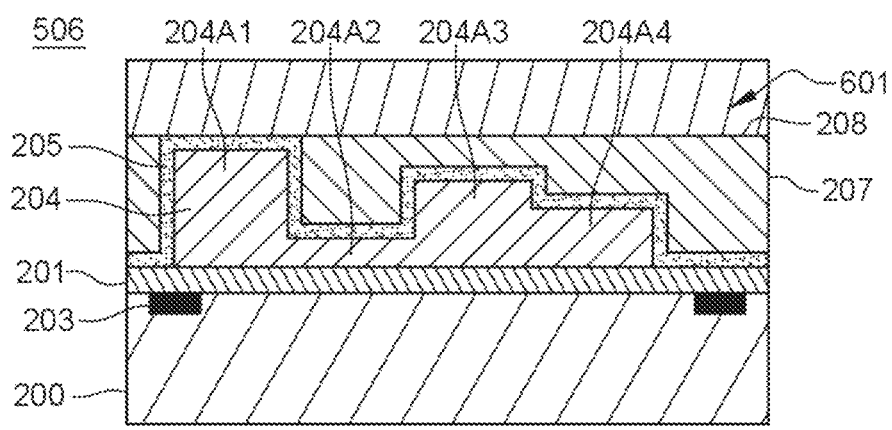
[Fig. 36]
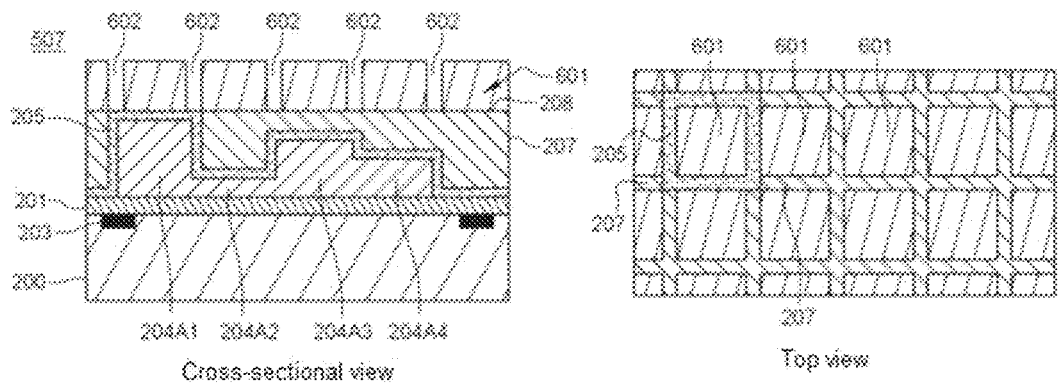
Cross-sectional view    Top view

[Fig. 37]
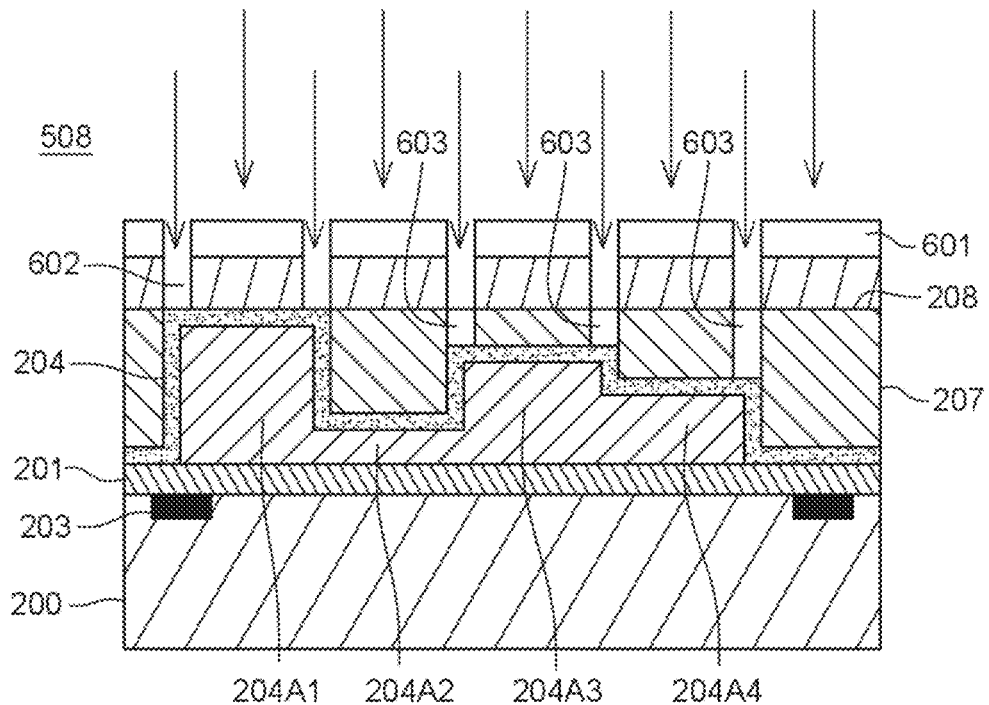
[Fig. 38]
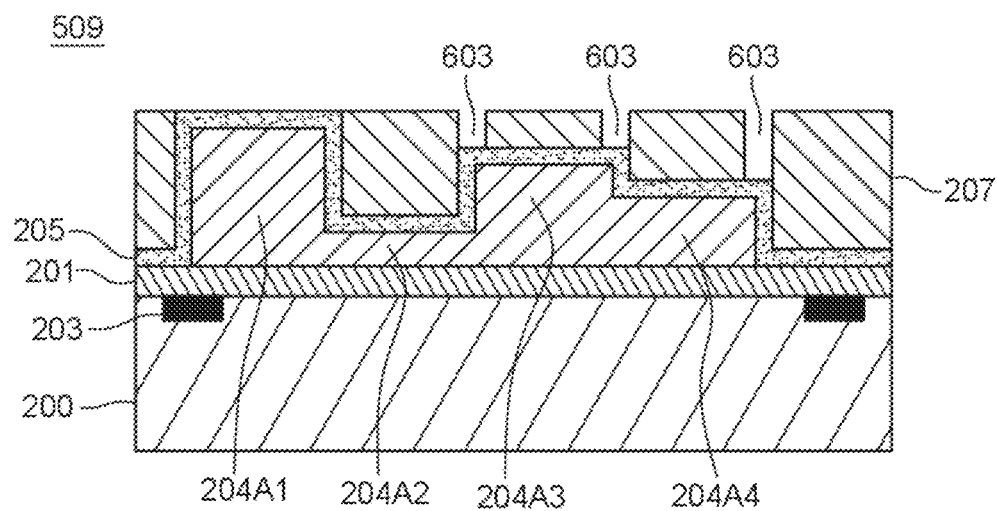

[Fig. 39]
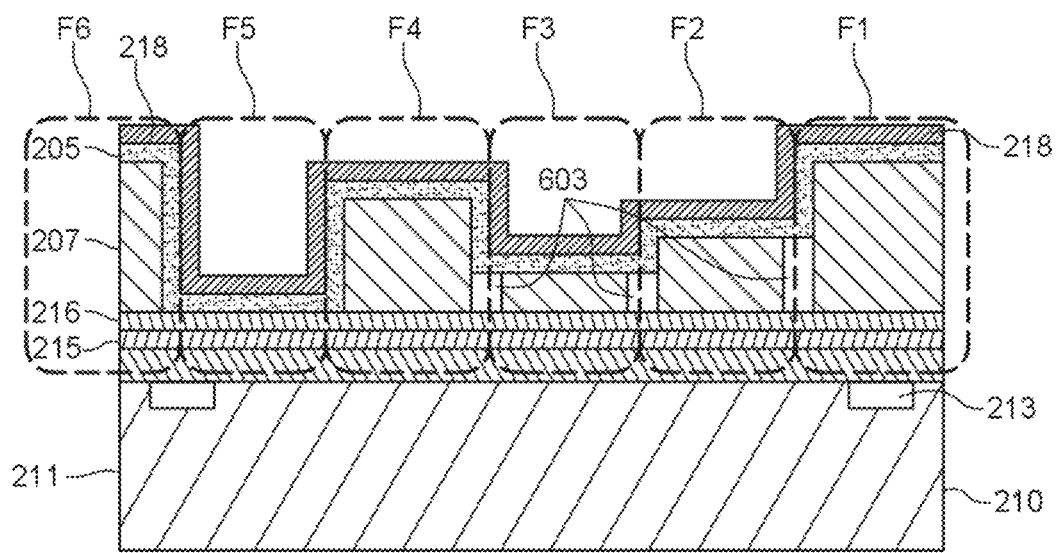

[Fig. 40]
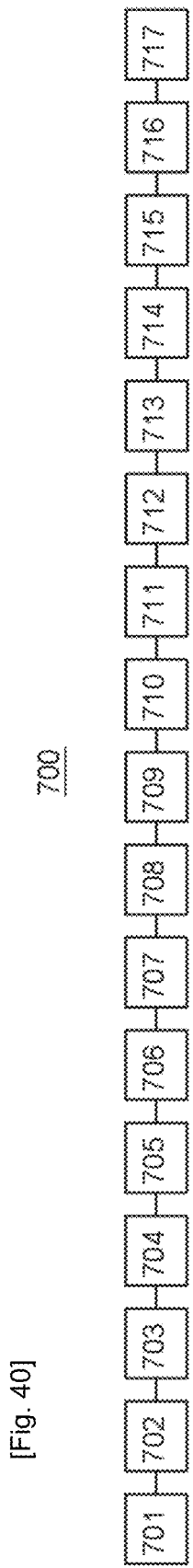

[Fig. 41]
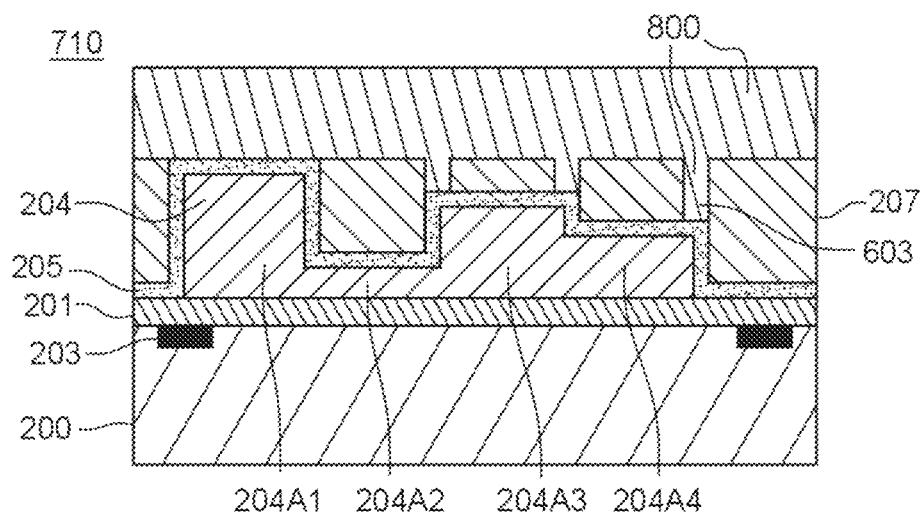
[Fig. 42]
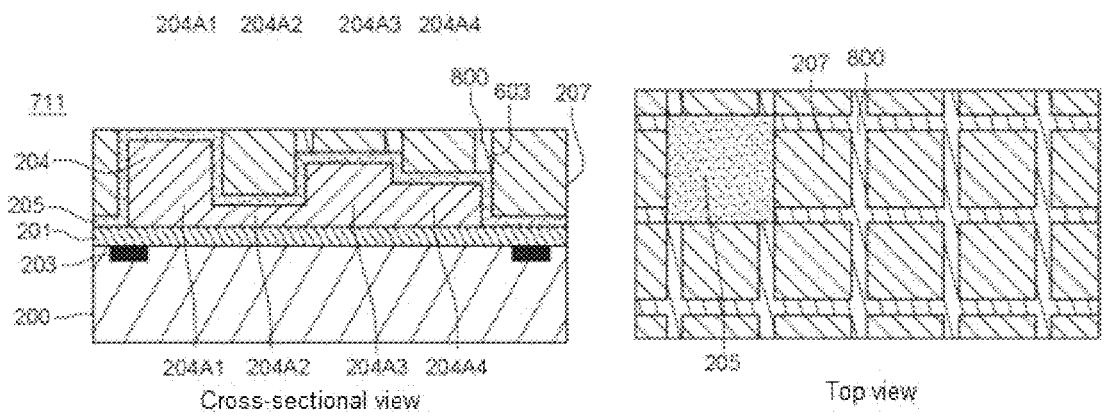
Cross-sectional view        Top view

[Fig. 43]
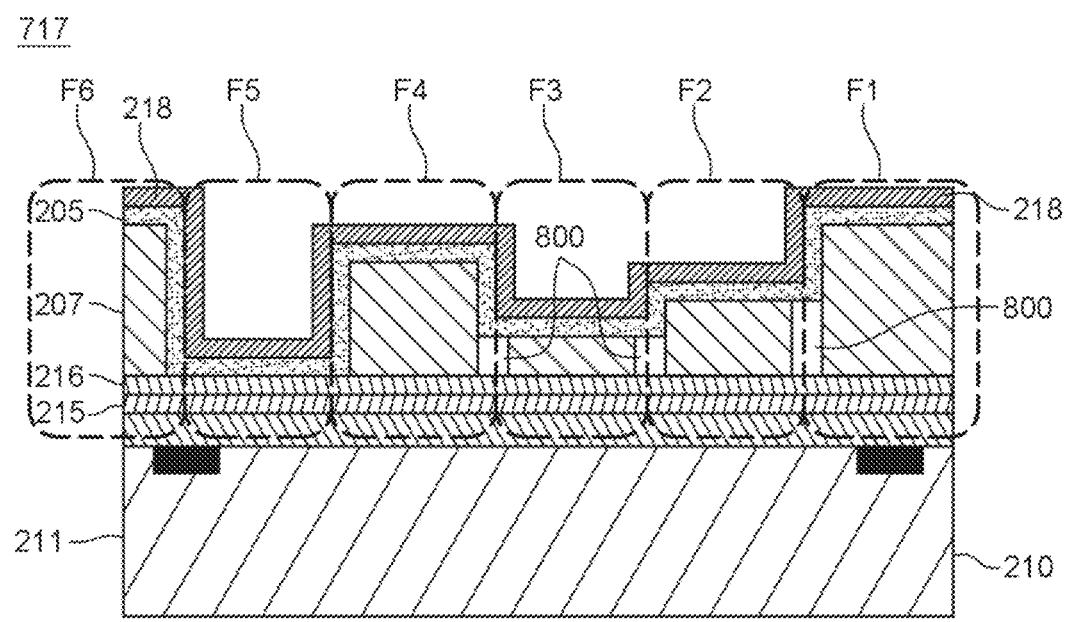

[Fig. 44]
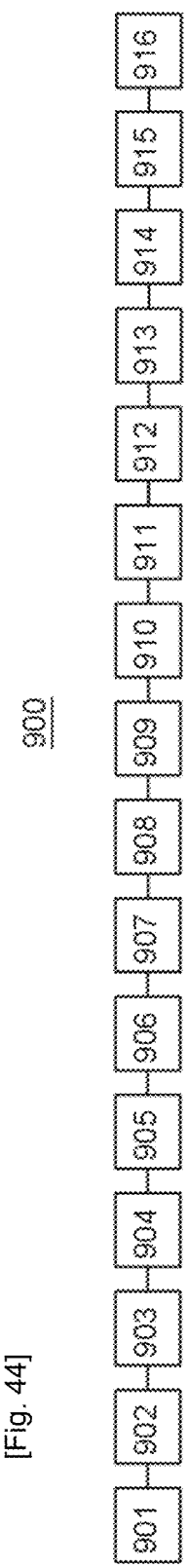

[Fig. 45]
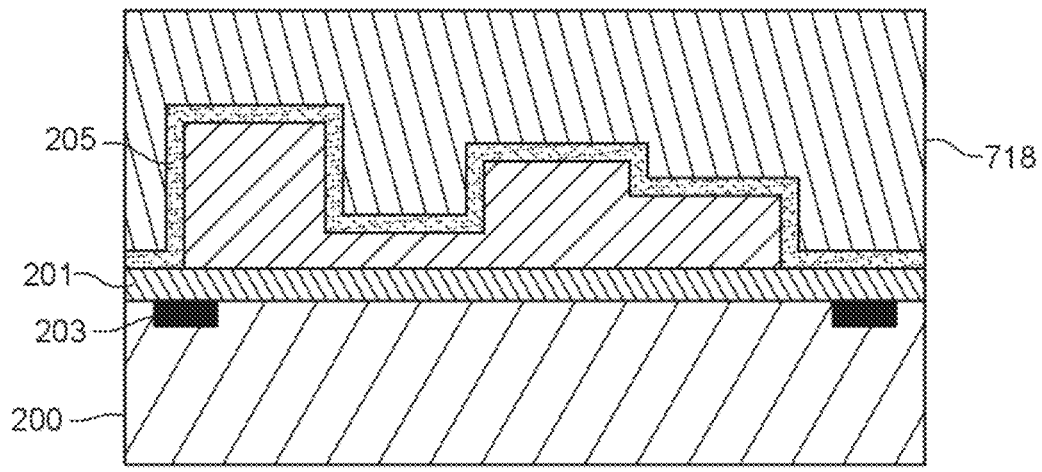
[Fig. 46]
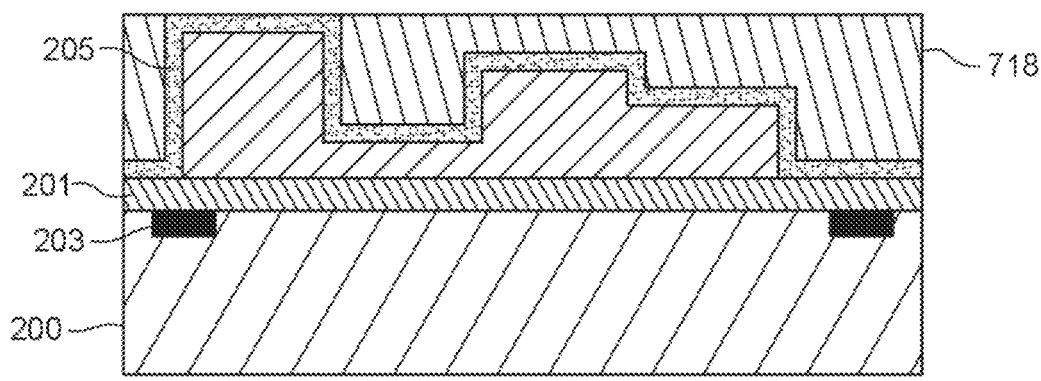
[Fig. 47]
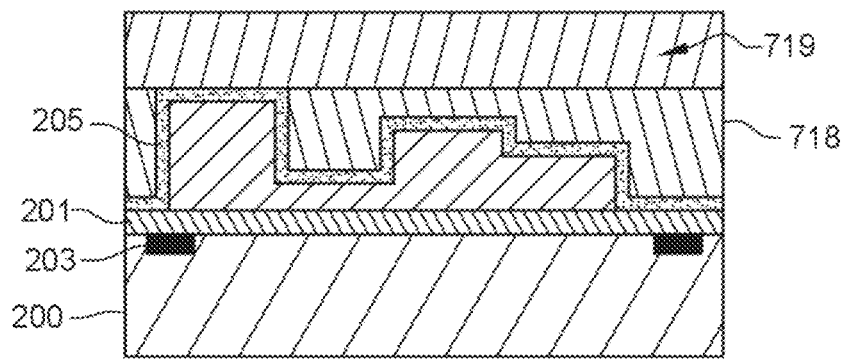

[Fig. 48]
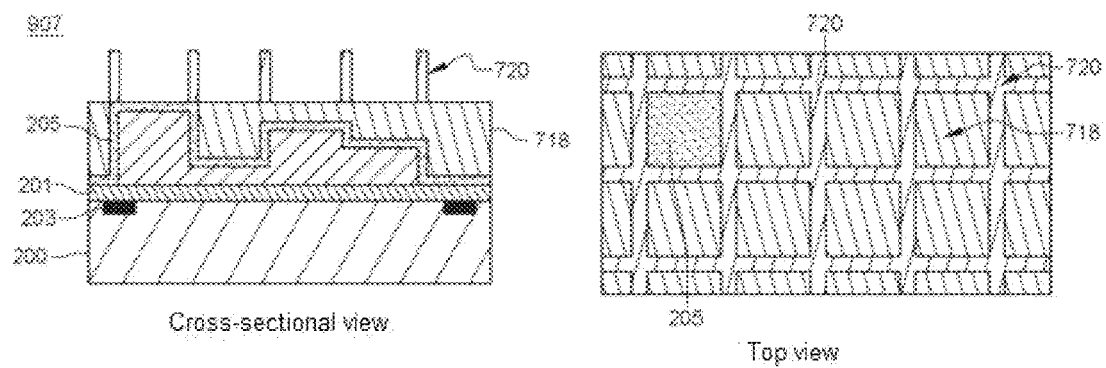
[Fig. 49]
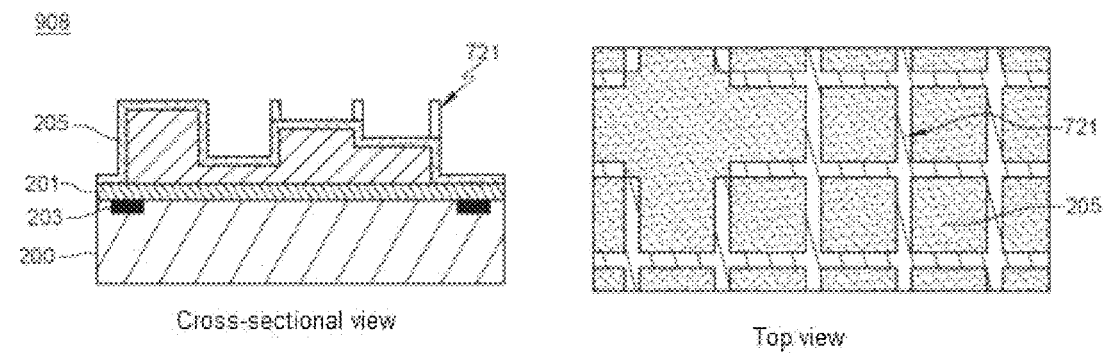

METHOD FOR MANUFACTURING A MULTISPECTRAL FILTER FOR ELECTROMAGNETIC RADIATION

CROSS-REFERENCE TO RELATED APPLICATIONS

This application claims priority to French Patent Application No. 2200868, filed Feb. 1, 2022, the entire content of which is incorporated herein by reference in its entirety.

FIELD

The technical field of the invention is that of spectral filtering, in particular for imaging applications and making coloured filters for CMOS-type image sensors, liquid crystal display devices or light-emitting diodes. The invention can also be implemented in light-emitting devices.

The present invention relates to a method for manufacturing a multispectral filter for electromagnetic radiation.

BACKGROUND

A spectral filter or colour filter filters light by wavelength so as to provide information about the intensity of light in certain wavelengths. Several colour filters can be combined so as to form, for example, red-green-blue (RGB) filters that provide information on the intensity of these three colours.

In particular, metal/dielectric type colour filters which are made from a Fabry-Perot cavity are known. These filters comprise one or more dielectric (or possibly semiconducting) cavities formed between two thin metal films having a metal mirror function so as to form a Fabry-Perot cavity. An example of this filter type is described in U.S. Pat. No. 6,031,653. Generally, the metal/dielectric stacks are different depending on the position on the optoelectronic component (for example, an image sensor). The transmission of the filter is set by adjusting the thickness of the cavity. Thus, in operation, part of the incident light corresponding to the wavelength of the filter is transmitted through it as a coloured beam, while the rest of the incident light is reflected. In general, the thickness of the dielectric layer fixes the central transmitted wavelength, while the thickness of the metal layers enables the spectral transmission width to be set. Besides, the use of several Fabry-Perot cavities enables the spectral transmission profile of the filter to be modified. A filter of this type is made using conventional semiconductor manufacturing techniques. Thus, to obtain a red-green-blue filter, it is advisable to form at least one dielectric cavity with a thickness of three different values. This entails significant technological restrictions, including at least one masking and then etching step for each dielectric cavity made.

It has also been shown that a multispectral filter array could be used for imaging directly on an optical sensor array using a CMOS-compatible manufacturing technique (bottom-up approach). These techniques are described in EP2522968.

More recently, the feasibility of optically functional devices following the creation of Fabry-Perot cavities above a CMOS image sensor device has also been described (see WO2019/239139).

All of the above-discussed solutions require numerous successive lithography and etching steps to make the different thicknesses of dielectric layers for ensuring filtering of the different colours.

Furthermore, when etching structures, various phenomena can lead to profile deformations, etch non-uniformities caused by "ARDE" (Aspect Ratio Dependent Etching) effects or degraded surface qualities. However, it is important to maintain the AR (Aspect Ratio) form factor for devices such as multispectral filters.

SUMMARY

An aspect of the invention offers a solution to the problems previously discussed, by providing a method for manufacturing a multispectral filter for electromagnetic radiation which makes it possible to dispense with the successive steps of lithography and etching of dielectric material for making the different dielectric thicknesses and obtaining improved profiles and surface qualities.

To do so, an aspect of the invention is a method for manufacturing a multispectral filter for electromagnetic radiation, the filter including at least two colour filters, each filter including a first reflective layer, a second reflective layer, a layer of dielectric material of Fabry-Perot cavity between the first reflective layer and the second reflective layer, the thickness of the dielectric layer of both colour filters being different and each of both filters facing a photoelectric transducer, the method including the following steps of:

Depositing a resin layer onto a substrate, called the handle substrate;

Three-dimensionally structuring the resin layer by lithography so as to obtain at least two resin patterns of different heights, at least one of the patterns having a maximum reference height, the height being measured perpendicularly to the plane of the substrate;

Depositing a layer made of the dielectric material intended to form the dielectric patterns of the Fabry-Perot cavities, the layer of dielectric material covering the entire resin patterns by having an upper surface, each point of which is located at a height relative to the handle substrate greater than the maximum reference height;

Planarising by removal of the dielectric material with a selective stop at the top of the highest resin pattern;

Transferring the planarised face of the handle substrate to the upper face of a substrate, called the carrier substrate, including at least two photoelectric transducers, each of the patterns facing a photoelectric transducer, a reflective layer intended to form the first reflective layer of both colour filters being positioned at the transfer interface between the handle substrate and the carrier substrate;

Removing the handle substrate;

Removing the resin so as to release at least two dielectric patterns of Fabry-Perot cavities of different thicknesses on the surface;

Depositing a reflective layer onto the at least two dielectric patterns of Fabry-Perot cavity, forming the second reflective layer of both colour filters.

Thanks to the invention, the Fabry Perot cavities are made on a temporary support substrate, called the handle substrate, by filling a 3D resin structure previously made by 3D lithography obtained in one step, thus dispensing with the numerous successive steps of lithography and etching the dielectric material forming the core of the cavities. The support substrate is then transferred to a substrate supporting the optoelectronic components of interest. Another benefit of an aspect of the invention is that the patterns in the dielectric material forming the cores of the Fabry-Perot cavities are not transferred vertically via a conventional etching approach, thus enabling good surface quality and the desired form factor to be maintained.

In addition to the characteristics discussed in the previous paragraph, the method of the invention may have one or more of the following additional characteristics, considered individually or in any technically possible combination:

the structuring step is followed, prior to depositing the layer made of the dielectric material intended to form the dielectric patterns of the Fabry-Perot cavities, by a step of conformally depositing an encapsulation layer onto the resin patterns.

The lithography used for the structuring step is a so-called grayscale lithography.

the reflective layer intended to form the first reflective layer of the colour filters is previously deposited onto the carrier substrate above the photoelectric transducers.

a layer of dielectric material is deposited onto the reflective layer of the carrier substrate so as to ensure a dielectric/dielectric contact when transferring the planarised face of the handle substrate to the upper face of the carrier substrate.

The method according to an embodiment of the invention includes a step of making alignment marks, the alignment marks being made in the handle substrate or in the resin layer, alignment marks also being present in the carrier substrate so as to ensure that each of the resin patterns faces a photoelectric transducer.

The method according to an embodiment of the invention includes a step of depositing a barrier layer prior to the step of depositing the resin layer, the removal of the handle substrate stopping on the barrier layer and being followed by the removal of the barrier layer so as to release the structured resin layer on the surface.

According to a first alternative, the method according to the invention includes a step of making air walls separating the dielectric patterns of Fabry-Perot cavities.

According to a second alternative, the method according to the invention includes a step of making walls of material having an optical refractive index strictly lower than the refractive index of the dielectric material intended to form the dielectric patterns of the Fabry-Perot cavities, the walls separating the dielectric patterns of the Fabry-Perot cavities.

The method according to an embodiment of the invention includes, in addition to making at least two colour filters, each filter including a first reflective layer, a second reflective layer, a layer of dielectric material of Fabry-Perot cavity between the first reflective layer and the second reflective layer, making at least one other colour filter including a first reflective layer, a second reflective layer, a layer of dielectric material of Fabry-Perot cavity, called of a second type, between the first reflective layer and the second reflective layer, the dielectric material of this other colour filter being different from the dielectric material of both colour filters Beneficially, the step of three-dimensionally structuring the resin layer by lithography is carried out so as to obtain a free location in which the dielectric material intended to form the pattern of the Fabry-Perot cavity of a second type is deposited.

The invention and its various applications will be better understood upon reading the following description and examining the accompanying figures.

BRIEF DESCRIPTION OF THE FIGURES

The figures are set forth by way of indicating and in no way limiting purposes of the invention.

FIG. 1 shows a schematic representation of a block diagram of the method according to a first embodiment of the invention;

FIG. 2, FIG. 3, FIG. 4, FIG. 5, FIG. 6, FIG. 7, FIG. 8, FIG. 9, FIG. 10, FIG. 11, FIG. 12 and FIG. 13 illustrate the steps of the method of FIG. 1;

FIG. 14 shows a schematic representation of a block diagram of the method according to a second embodiment of the invention;

FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32 and FIG. 33 illustrate the steps of the method of FIG. 14;

FIG. 34 shows a schematic representation of a block diagram of the method according to a third embodiment of the invention;

FIG. 35, FIG. 36, FIG. 37, FIG. 38 and FIG. 39 illustrate the steps of the method of FIG. 34;

FIG. 40 shows a schematic representation of a block diagram of the method according to a fourth embodiment of the invention;

FIG. 41, FIG. 42 and FIG. 43 illustrate the steps of the method of FIG. 40;

FIG. 44 shows a schematic representation of a block diagram of the method according to a fifth embodiment of the invention;

FIG. 45, FIG. 46, FIG. 47, FIG. 48 and FIG. 49 illustrate the steps of the method of FIG. 44.

DETAILED DESCRIPTION

The figures are set forth as indication and in no way limiting purposes of the invention.

It should be first reminded that, in general and well known to the person skilled in the art, a metal/dielectric type colour filter made from a Fabry-Perot cavity is obtained by dimensioning the thickness of the dielectric layer formed between both metal layers. If the filtering of several colours is desired on a same component, it is then desirable to be able to obtain a dielectric of variable thickness on this same component.

This dimensioning is carried out, for example, using an electromagnetic calculation program such as the Abeles matrix transfer formalism or a diffraction calculation for pixels whose size is close to the wavelength such as the Modal Fourier Expansion Method formalism or Rigorous Coupled Wave Analysis (RCWA).

These calculation programs determine the optimal parameters of the metal-dielectric stacks for each pixel. In particular, the calculation takes account of the thicknesses of the metal and dielectric layers as well as their indices, the spectrum and the angular distribution of the incident light. For example, in the case of Fabry-Perot filters, the central wavelength of the filter is determined approximately by the following formula $$\lambda_{res} = \frac{2hn \cdot \cos\theta}{m - \frac{\phi_1 + \phi_2}{2\pi}}$$

where h is the thickness of the cavity, that is, approximately the thickness of the dielectric layer, m, a positive integer between 1 and 10, is the order of the cavity, n is the effective index of the cavity, and φ1 and φ2 are the phase shifts at the reflection from the metal mirrors (determined by the nature of the materials involved and the wavelength considered), θ is the angle of incidence of the incident light on the filter (counted from the perpendicular to the filter surface).

Once the order of the cavity has been chosen, the angle of attack known, the index and the phase shifts known, it only remains to determine an approximate thickness h so that the cavity is centred on a particular wavelength. Once the filter function has been calculated for each filter and each wavelength, the thicknesses h of the dielectrics are then adjusted as a function of the desired performance (search for a good signal to noise ratio, maximum transmission, etc.).

Another more empirical method consists in calculating the stack response for several thicknesses h and choosing h such that the filter resonance peak (λres) is positioned in accordance with the specifications.

FIG. 1 shows a schematic representation of a block diagram of a method 100 according to a first embodiment of the invention.

The first step 101 of the method 100 illustrated in [FIG. 2] consists in depositing, onto a substrate 200, called the handle substrate, a so-called barrier layer 201 which will serve as a barrier layer during subsequent release steps. The substrate 200 can, for example, be a Si substrate, a Silicon On Insulator (SOI) substrate or a glass or sapphire substrate. The barrier layer 201 can be, for example, a layer of dielectric material such as SiN. Beneficially, this first step 101 also includes a sub-step for making alignment marks 203, the alignment marks being made in the handle substrate 200. It will be seen later that these alignment marks 203 are all the more useful for small pixels or in the case of using isolation walls. These marks 203 are made by techniques known to the person skilled in the art, such as lithography and etching techniques.

The second step 102 illustrated in [FIG. 3] consists in depositing a resin layer and then three-dimensionally structuring the resin layer 204. The 3D structuring is carried out by a lithography step. This lithography can be in an embodiment a grayscale lithography (followed by a stabilisation of the grayscale resin by thermal or ultraviolet method). Other lithography techniques such as two-photon lithography or nanoim print lithography may also be used for making the resin structure 204. The structure 204 includes a plurality of 3D patterns 204Ai (here 4 patterns 204A1, 204A2, 204A3 and 204A4). The dimensions of each pattern can be freely fixed in the three directions of space Oxyz (where Oxy is the plane of the figure, the axis Oy being along the direction perpendicular to the plane of the substrate 200 and the axis Oz being along the direction perpendicular to the plane of the figure).

As an illustration, [FIG. 4] shows an image of 3 3D patterns z1, z2 and z3 of different dimensions obtained by structuring a resin layer.

According to an embodiment of the invention, it is advisable to have at least two resin patterns 204Ai of different heights (here the 4 patterns each have different heights). Among all these patterns 204Ai, one of them, here the pattern 204A1, has a maximum so-called reference height Hmax, the height being measured perpendicularly to the plane of the substrate 200 along the axis Ox. The determination of the heights of each pattern 204Ai will be mentioned in the remainder of the description.

Beneficially, the method 100 according to the invention includes a third step 103 illustrated in [FIG. 5] consisting in making a conformal deposition of an encapsulation layer 205 on the resin patterns 204Ai. The material of the encapsulation layer 205 may be, for example, Al2O3 or SiO2 and the deposition will be carried out by, in an embodiment, a low-temperature deposition technique such as ALD ("Atomic Layer Deposition"). Beneficially, the material of the encapsulation layer 205 has an optical index close to (or even identical to) the optical index of the dielectric material used for the patterns of the Fabry-Perot cavities which will be defined in what follows. It should be noted that the material of the encapsulation layer 205 may also be a conformally deposited metal.

For each resin pattern 204Ai, the height of the pattern will be denoted as Hres(i), the height being measured perpendicularly to the plane of the substrate. Thus, for the pattern 204A1, Hres(1) is here equal to the reference height Hmax.

If the method 100 according to an embodiment of the invention includes the encapsulation step 103, Hres(i) includes both the thickness of the resin 204 but also the thickness of the encapsulation layer 205; in the absence of step 103, Hres(i) is formed solely by the thickness of the pattern 204Ai.

The method 100 according to the invention then includes a step 104 illustrated in [FIG. 6] aiming at depositing a layer 206 made of the dielectric material intended to form the dielectric patterns of the Fabry-Perot cavities. The layer 206 of dielectric material covers the entire resin patterns 204Ai. In other words, it has an upper surface 219 (not necessarily planar), each point of which is located at a height, relative to the handle substrate, greater than the maximum reference height Hmax. Thus, the layer 206 completely fills the voids between the resin patterns 204Ai and is located entirely above the highest resin pattern 204A1 of the structure. The material of the layer 206 is an embodiment of, but not limited to, a material which is transparent in the visible range, such as an organic material of the polymer type or an inorganic material (oxide, silicon nitride, alumina, etc.). It should be noted that aspects of the invention are not limited to the visible range and that other materials transparent at other wavelengths, in the infrared for example (for example using silicon), can be used. It will be seen in another embodiment that the invention can also be applied to several materials to cover a wider spectral range. It should be noted that this step could be carried out in the absence of the encapsulation layer (that is, directly on the 3D resin patterns 204Ai): however, the benefit of the encapsulation layer is to prevent a possible deformation of the resin patterns, the latter being likely to liquefy at certain temperatures (that is, for example during the deposition of the layer 206): consequently, the encapsulation layer makes it possible to maintain the 3D structure during the deposition of the layer 206. Another benefit of the encapsulation layer is that it facilitates the deposition of the layer 206, especially if the materials of the layers 204 and 206 are very different (for example, organic on one side and inorganic on the other). Depositing the layer 206 directly onto the patterns 204Ai could indeed cause adhesion problems. To overcome this difficulty, an adapted material of the encapsulation layer 205 can be chosen to receive the dielectric material of the layer 206.

The method 100 then includes in [FIG. 7] a step of planarising the layer 206 made in the dielectric material intended to form the dielectric patterns of the Fabry-Perot cavities so as to form a layer 207 planarised on the surface by removal of the dielectric material of the layer 206. The planarisation step can be carried out by an etching step of the etch-back type, possibly followed by a CMP (Chemical Mechanical Polishing) step. The planarisation is carried out with a stop on the encapsulation layer 205 located at its highest level (that is, at the reference height of the pattern 204A1). It should be noted that in the absence of an encapsulation layer 205, the planarisation would stop directly on the pattern 204A1. One of the benefits of the presence of the encapsulation layer is that it protects the 3D resin patterns 204Ai which can be made of a softer material without being damaged.

The height of the dielectric material of the layer 206 above the pattern 204Ai will be denoted as Hdiel(i). For all patterns 204Ai corresponding to a future pixel of the filter, the sum Hdiel(i)+Hres(i) has to be constant and equal. The height Hdiel(i) corresponds to the thickness of the dielectric layer of the ith Fabry-Perot cavity and can be determined according to the methods mentioned above (as a function of the specifications for the desired filtering): thus, by subtraction, between the constant height Hdiel(i)+Hres(i) given whatever the value of i and the height Hdiel(i), the height Hres(i) of each 3D resin pattern to be manufactured in step 102 is obtained (if necessary taking account of the thickness of the encapsulation layer 205).

Step 106 of the method 100 represented in [FIG. 8] consists in turning over the device 209 obtained at the end of step 105 to transfer the planarised face of the device 209 formed by the handle substrate to the upper face 212 of a substrate, called the carrier substrate 210.

The carrier substrate 210 includes a substrate 211 in which alignment marks 213 are made. These alignment marks 213 will be placed facing the alignment marks 203 of the device 209. On the substrate 211, a plurality of (at least two) photoelectric transducers 214Ai are formed, each delimited by dotted lines (here 4 photoelectric transducers 214A1, 214A2, 214A3 and 214A4 are represented). The photoelectric transducers can function either as collectors of light from the filters or as emitters of light to the filters. In the case of collectors, the transducers can be, for example, CMOS-type photodiodes. In the case of emitters, the transducers may be, for example, LEDs, QLED type diodes or LASER diodes, in which case the emitters have a broader emission spectrum than the corresponding Fabry-Perot cavities. The carrier substrate 210 further includes above the transducers 214Ai, a reflective layer 215 intended to form the first reflective layer (or mirror layer) of the Fabry-Perot colour filters. In the embodiment in FIG. 8, and in a non-limiting manner, a dielectric layer 216 is arranged above the reflective layer 215 aiming at promoting the transfer of the planarised surface 208 of the dielectric layer 207. Assuming the presence of this dielectric layer 216, it is advisable to take account of the thickness of this layer in the value of Hdiel(i) for the dimensioning of the 3D resin patterns 204Ai.

When transferring the planarised face 208 of the device 209 formed by the handle substrate to the upper face 212 of the carrier substrate 210, beneficially, alignment marks (203 and 213, respectively) are used so that each of the 3D resin patterns 204Ai faces a photoelectric transducer 214Ai. In other words, the patterns 204A1, 204A2, 204A3 and 204A4 face the transducers 214A1, 214A2, 214A3 and 214A4 respectively. As discussed above, it is possible to dispense with the use of alignment marks for sufficiently large pattern sizes. However, fine alignment will result in the presence of alignment marks 203 and 213.

Step 107 of the method 100 in [FIG. 9] is the continuation of step 106 and is intended to bond the planarised surface 208 of the dielectric layer 207 to the surface 212 of the dielectric layer 216.

According to an alternative not represented, the presence of the dielectric layer 216 on the support substrate 210 could be dispensed with and the reflective layer could be divided into two reflective layers, one of which would be present on the device 209 formed by the handle substrate and the other such as the layer 215 illustrated in FIG. 8. In this case, the bonding between the handle device 209 and the support substrate 210 will be via a bonding between both reflective layers (metal/metal bonding instead of dielectric/dielectric bonding). According to this alternative as in the previous embodiment, the reflective layer intended to form the first reflective layer of both colour filters is positioned at the transfer interface between the handle substrate and the carrier substrate.

In accordance with [FIG. 10], the method 100 according to an embodiment of the invention includes a step 108 of removing the handle substrate 200 with a stop on the barrier layer 201 which serves as a protective layer for the resin patterns 204Ai. This operation can be done for example by etching, CMP polishing or grinding.

The method 100 then includes:
- a step 109 of removing the barrier layer 201 illustrated in [FIG. 11], for example by a dry or wet etching method so as to release the resin on the surface.
- a step 110 of removing the resin 204 (and thus the entire patterns 204Ai) illustrated in [FIG. 12] with a stop on the encapsulation layer 205, for example by a stripping type chemical etching technique; it is noticed here another benefit of the encapsulation layer 205 which facilitates the selective removal of the resin 204 with respect to the dielectric material of the layer 206.

Step 110 makes it possible to release a plurality (at least two) of dielectric patterns 217Ai of Fabry-Perot cavities of different thicknesses on the surface: here, five patterns 217A1, 217A2, 217A3, 217A4 and 217A5 are represented. Provided that the thickness of each resin pattern has been properly chosen and taking account of the thickness of the encapsulation layer 205 and the dielectric layer 216, if any, each pattern 217Ai can form the core of a Fabry-Perot cavity (including where there was no resin that gives rise to the dielectric pattern 217A5; in this case, it is also advisable to provide a photoelectric transducer 214A5 at this location on the substrate 211).

As illustrated in [FIG. 13], the method 100 according to an embodiment of the invention then includes a step 111 of depositing a reflective layer 218 onto the dielectric patterns 217Ai of Fabry-Perot cavity (here on the encapsulation layer 205 covering the filters, it being understood that removal of this layer 205 is also possible). This reflective layer 218 forms the second reflective layer of the Fabry-Perot cavity type colour filters Fi obtained according to this step (here five filters F1 to F5). Each filter Fi is formed by a part of the first reflective layer 215, the dielectric pattern 217Ai and a part of the reflective layer 218. Each filter Fi faces a corresponding transducer (that is, pixel) 214Ai. The reflective layer 218 is, for example, conformally deposited by Chemical Vapor Deposition (CVD) or Physical Vapor Deposition (PVD). In an embodiment, the layer 218 is deposited continuously onto all of the dielectric patterns 217Ai, including on the flanks of the latter. Beneficially, the thickness of the reflective layer 218 will be controlled to be constant, at least on the top of the patterns but also, in an embodiment, on the flanks (hence the beneficial use of a conformal deposit). As already discussed, it is noticed here that the five colour filters obtained by the method 100 according to an embodiment of the invention have freely fixed dimensions along the three axes Ox, Oy and Oz, the thickness measured along the axis Oy fixing the desired resonance peak and the other dimensions along the axes Ox and Oz being able to be freely fixed according to the desired light confinement and possible space restrictions.

FIG. 14 shows a schematic representation of a block diagram of a method 300 according to a second embodiment of the invention. As already discussed above, this second embodiment uses several dielectric materials for making the Fabry-Perot cavities so as to cover a wider spectral range, for example the visible and the infrared.

The method 300 includes a first step 301 illustrated in [FIG. 15] identical to step 101 in FIG. 2, with references 200, 201 and 203 being replaced by references 400, 401 and 403 respectively.

The second step 302 illustrated in [FIG. 16] consists in depositing a resin layer 404 and then in three-dimensionally structuring the resin layer 404. The 3D structuring is carried out by a lithography step. This lithography can be a grayscale lithography (followed by a thermal or ultraviolet stabilisation of the grayscale resin). Other lithography techniques such as two-photon lithography or nanoimprint lithography may also be used for making the resin structure 404. The structure 404 includes a plurality of 3D patterns 404Ai (here 6 patterns 404A1, 404A2, 404A3, 404A5, 404A6 and 404A7). It is possible to freely fix the dimensions of each pattern in the three directions of space Oxyz (where Oxy is the plane of the figure, the axis Oy being along the direction perpendicular to the plane of the substrate 200 and the axis Oz being along the direction perpendicular to the plane of the figure).

According to an embodiment of the invention, it is advisable to have at least two resin patterns 404Ai of different heights (here the 4 patterns each have different heights). Among all these patterns 404Ai, at least one of them, here the patterns 404A1 and 404A5, has a maximum so-called reference height Hmax, the height being measured perpendicularly to the plane of the substrate 400 along the axis Ox. The determination of the heights of each pattern 404Ai has already been explained above with reference to the first embodiment of the method according to the invention. According to this second embodiment and contrary to FIG. 3, it is observed here that the resin deposition and structuring step has left a location 419 on the barrier layer 401 free. It will be seen later that this location 419 is reserved for the subsequent creation of a second type of Fabry-Perot cavity using a dielectric material other than that provided at the locations of the patterns 404Ai.

Beneficially, the method 300 according to an embodiment of the invention includes a third step 303 illustrated in [FIG. 17] consisting in carrying out a conformal deposition of an encapsulation layer 405 on the resin patterns 404Ai and on the free location 419. The material of the encapsulation layer 405 may be, for example, $Al_2O_3$ or SiO2 and the deposition will be carried out by a low-temperature deposition technique such as ALD ("Atomic Layer Deposition").

The method 300 according to the invention then includes a step 304 illustrated in [FIG. 18] aiming at depositing a layer 406 made of the dielectric material intended to form the dielectric patterns of the first type Fabry-Perot cavities. The layer 406 of dielectric material covers the entire resin patterns 404Ai as well as the location 419 which is completely filled with dielectric material. In other words, it has an upper surface 427 (not necessarily planar), each point of which is located at a height, relative to the handle substrate, greater than the maximum reference height Hmax. Thus, the layer 406 completely fills the voids between the resin patterns 204Ai and is located entirely above the highest resin pattern 404A1 of the structure. The material of the layer 406 is in an embodiment, but not limited to, a transparent material in the visible range, such as an organic material of the polymer type or an inorganic material (oxide, silicon nitride, alumina, etc.).

The method 300 then includes in [FIG. 19] a step of planarising the layer 406 made in the dielectric material intended to form the dielectric patterns of the Fabry-Perot cavities of a first type so as to form a planarised layer on the surface by removal of the dielectric material of the layer 406. The planarisation step can be carried out by an etch-back type etching step, possibly followed by a CMP (Chemical Mechanical Polishing) step. The planarisation is carried out with a stop on the encapsulation layer 405 located at its highest level (that is, at the reference height of patterns 404A1 and 404A5).

Step 306 of the method 300 represented in [FIG. 20] consists in turning over the device 409 obtained at the end of step 305 to transfer the planarised face 408 of the device 409 formed by the handle substrate to the upper face 412 of a substrate, called the carrier substrate 410.

As in the first embodiment, the carrier substrate 410 includes a substrate 411 in which alignment marks 213 are made. These alignment marks 413 will be placed facing the alignment marks 403 of the device 409. On the substrate 411 a plurality of (at least two) photoelectric transducers 414Ai are formed, each delimited by dotted lines (here 7 photoelectric transducers 414A1, 414A2, 414A3, 414A4, 414A5, 414A6 and 414A7 are represented). The carrier substrate 410 further includes above the transducers 414Ai, a reflective layer 415 intended to form the first reflective layer (or mirror layer) of the Fabry-Perot colour filters. In the embodiment in FIG. 20, and in a non-limiting manner, a dielectric layer 416 is arranged above the reflective layer 415 aiming at promoting the transfer of the planarised surface 408 of the dielectric layer 406.

When transferring the planarised face 408 of the device 409 formed by the handle substrate to the upper face 412 of the carrier substrate 410, beneficially the alignment marks (403 and 413, respectively) are used so that each of the 3D resin patterns 404Ai and the free location 419 faces a photoelectric transducer 414Ai. In other words, the patterns 404A1, 404A2, 404A3, 404A5, 404A6 and 404A7 face the transducers 414A1, 414A2, 414A3, 414A5, 414A6 and 414A7 respectively. The free location 419 faces the transducer 414A4.

Step 307 of the method 300 represented in [FIG. 21] is the continuation of step 306 and aims at bonding the planarised surface 408 of the dielectric layer 406 to the surface 412 of the dielectric layer 416.

In accordance with [FIG. 22], the method 300 according to an embodiment of the invention includes a step 308 of removing the handle substrate 400 with a stop on the barrier layer 401 which serves as a protective layer for the resin patterns 404Ai. This operation can be done for example by etching, CMP polishing or grinding.

The method 300 then includes a step 309 of removing the barrier layer 401 illustrated in [FIG. 23], for example by a dry or wet etching method so as to release the resin patterns 404Ai and the free location 419 on the surface.

According to steps 310 to 312 of the method 300 according to an embodiment of the invention, a photolithography operation is carried out by first depositing or spreading a layer of hard mask 420 (made of SiO2, for example) above the patterns 404Ai and the free location 419. A light-sensitive resin layer 421 is then spread over the hard mask layer ([FIG. 24]). By means of a lithography operation known to the person skilled in the art, the resin layer 421 is opened (opening 422) vertically to the free location 419 provided for making a Fabry-Perot cavity of a second type ([FIG. 25]). The opening 422 is then transferred from the resin layer 421 into the hard mask 420 by etching ([FIG. 26]) so that the opening 422 vertically overhangs the free location 419. The resin layer is then removed.

According to step 313 of the method 300 illustrated in FIG. 27, two dry etching steps are carried out in order to remove the part 423 of the encapsulation layer 405 facing the opening 422 and the dielectric material intended to form the Fabry-Perot cavities of the first type filling the free location 419. The step of etching the dielectric material stops at the reflective layer 415 so as to form an empty opening 425 in the free location 419.

The method 300 according to an embodiment of the invention then includes a step 314 illustrated in [FIG. 28] aiming at depositing a layer 424 made of the dielectric material intended to form the dielectric pattern of at least one Fabry-Perot cavity of a second type. Here, the layer 424 of dielectric material covers the entire hard mask 420 and completely fills the opening 425 by overflowing therefrom. In other words, the layer 424 has an upper surface 426 (not necessarily planar), each point of which is located at a height, relative to the handle substrate, greater than the maximum reference height Hmax to which the height $h_{HM}$ of the hard mask 420 is added. The material of the layer 424 may be an organic or inorganic dielectric material.

The method 300 then includes in [FIG. 29] a planarisation step 315 with a stop on the hard mask 420, of the layer 424 made of the dielectric material intended to form the dielectric patterns of the Fabry-Perot cavities of a second type so as to eliminate the excess dielectric material above the hard mask 420 and to planarise the upper surface of the volume of dielectric filling the opening 425 thus forming a dielectric pattern 426 of the electrical cavity of a second type. The planarisation step may be carried out by a RIE (Reactive Ion Etching) type dry etching step or a CMP (Chemical Mechanical Polishing) step.

According to a first alternative of the method 300, the latter includes a step 316 illustrated in [FIG. 30] consisting in selectively removing the hard mask 420 so as to let an excess thickness $h_{sup}$ protrude from the pattern 426 above the structured resin layer 404. This first alternative applies when the optical index of the dielectric material intended to form the Fabry-Perot cavities of a second type is such that the thickness of the cavities of a second type has to be greater than the height Hmax of the resin layer 404. Beneficially, the thickness $h_{sup}$ of the pattern 426 is less than or equal to the thickness $h_{HM}$ of the hard mask 420 (both thicknesses are substantially equal in FIG. 30).

The method 300 then includes a step 317 of removing the resin 404 (and thus all the patterns 404Ai) illustrated in [FIG. 31] with a stop on the encapsulation layer 405, for example by a stripping type chemical etching technique.

In step 317, the dielectric patterns 417Ai of Fabry-Perot cavities of a first type (here, the six patterns 417A1, 417A2, 417A3, 417A5, 417A6, and 417A7 are represented) are released on the surface in addition to the dielectric Fabry-Perot cavity pattern 426 of a second type. Provided that the thickness of each resin pattern has been appropriately chosen and taking account of the thickness of the encapsulation layer 405 and the dielectric layer 416, each pattern 417Ai may form the core of a Fabry-Perot cavity of a first type and the pattern 426 forms the core of a Fabry-Perot cavity of a second type.

As illustrated in [FIG. 32], the method 300 according to an embodiment of the invention then includes a step 318 of depositing a reflective layer 418 onto the dielectric patterns 417Ai of Fabry-Perot cavity of a first type (here on the encapsulation layer 205 covering the patterns) and on the dielectric pattern 426 of cavity of a second type. This reflective layer 418 forms the second reflective layer of the Fabry-Perot cavity type colour filters Fi obtained according to this step: here six filters F1, F2, F3, F5, F6 to F7 of a first type and one filter F4 of a second type). It is understood that this embodiment has been illustrated through making a single filter of a second type, but it is also possible to obtain several filters of a second type (in particular by leaving several locations free during step 301 represented in FIG. 16). Each cavity of a first type uses the same dielectric material and has a predetermined thickness enabling a specific filtering. The cavity F4 of a second type uses another dielectric material and, by means of this different material, enables a specific spectral filtering different from the cavities of the first type.

Each filter Fi is formed by a part of the first reflective layer 415, the dielectric pattern and a part of the reflective layer 418. Each filter Fi faces a corresponding photoelectric transducer 414Ai. The reflective layer 418 is, for example, conformally deposited by Chemical Vapor Deposition (CVD) or Physical Vapor Deposition (PVD).

A second alternative of the method 300 may be contemplated following the planarisation step 315, when the optical index of the dielectric material intended to form the Fabry-Perot cavities of a second type is such that the thickness of the cavities of a second type $H_{FP2}$ has to be lower than the height Hmax of the resin layer 404.

The method then includes a step 316' illustrated in [FIG. 33] following step 315 and consisting in selectively etching the second type dielectric material with respect to the hard mask 420 until the thickness $h_{FP2}$ of the desired pattern 426' is obtained. Once this step has been carried out, the hard mask 420 is removed and the following steps are identical to steps 317 to 318 (removal of the resin and deposition of a reflective layer forming the second reflective layer of the Fabry-Perot cavity type colour filters of the first and second type).

FIG. 34 shows a schematic representation of a block diagram of a method 500 according to a third embodiment of the invention. This third embodiment is particularly adapted when the dimensions of the pixels and thus the colour filters are reduced, typically in the order of the wavelength of light. The spatial overlap of light contributions from one Fabry-Perot cavity to another can degrade the efficiency of the overall device. This "crosstalk" phenomenon has already been observed for photoelectric transducers (that is, CMOS sensors). Over the last few years, pixel dimensions have been reduced continuously in order to offer high resolution sensors, especially for smartphones. This reduction in pixel size has two distinct consequences:

- The total amount of incident light arriving at each pixel decreases, implying that fewer and fewer photons reach the light-sensitive component. Collecting and properly guiding each photon within the component to the sensor is all the more important to ensure that the sensor is efficient.
- As the pixel size approaches the length of the light to be collected, diffraction comes into play, increasing the optical and spatial losses in the device.

In addition to the problems related to the reduction of pixel dimensions, the angle of incidence at which light enters the Fabry-Perot cavity is also a factor that should not be overlooked. Indeed, when oblique light rays reach the surface of the cavities, a certain part of the light passes through the physical border of the filter, to end its course in the neighbouring cavity. This unwanted, parasitic contribution distorts the collection of light at the device scale, and is another important source of crosstalk from one pixel to another.

The first five steps 501 to 505 are identical to the first five steps 101 to 105 of the method illustrated in FIGS. 2, 3, 4, 6 and 7 (for the sake of simplicity, the same references are used for the elements common to FIGS. 2, 3, 4, 6 and 7).

The sixth step 506 of the method 500 is illustrated in [FIG. 35] and consists in depositing or spreading on the planarised layer 207 of the dielectric material intended to form the Fabry-Perot cavity patterns and the encapsulation layer 205, a layer of light-sensitive or electron-sensitive resin 601.

The method 500 according to an embodiment of the invention then includes in [FIG. 36] a photolithography step 507 consisting in creating gaps 602 aligned with the borders of the future Fabry-Perot cavities. To do so, the layer of light- or electron-sensitive resin 601 is exposed using lithography equipment, in order to define on its surface a regular gap grid after development of the resin (open spaces in the resin up to the dielectric material 207 or up to the encapsulation layer 205).

The top view in FIG. 36 shows the regular grid of the resin gaps 602, the parts of the dielectric layer 207 seen through the gaps 602 and the part of the encapsulation layer 205 corresponding to the resin pattern 204A1. It should be noted that the representation of the patterns as squares is for illustrative purposes only. As explained several times earlier in the description, the dimensions of the patterns may be different from one pattern to another, and there is no requirement that the pattern be square in a top view (it could be a rectangular pattern, for example).

The method 500 according to an embodiment of the invention then includes in [FIG. 37] a photolithography step 508 consisting in transferring by dry or wet etching the gaps or open spaces 602 previously made in the layer 207 of dielectric material of the future Fabry-Perot cavities with a stop on the encapsulation layer 205 of the structured resin layer 204. This transfer enables an identical grid to be made in the dielectric layer 207 with gaps 603 substantially aligned with the flanks of the encapsulation layer 205. Each transferred gap thus defines the outer edges of each filtering cavity. Any remaining surface resin 601 not consumed at the end of the etching method may be removed, for example by a stripping-type cleaning method (step 509 illustrated in [FIG. 38]). It should be noted that the dimension of the gaps 603 thus opened in the dielectric material 207 may be taken into account, if necessary, in the lateral dimensioning (overall size) of the future Fabry-Perot cavities.

Steps 510, 511, 512, 513 and 514 are respectively identical to steps 106, 107, 108, 109 and 110 illustrated in FIGS. 8 to 12 and lead to the device illustrated in [FIG. 39]. This device is almost identical to the device in FIG. 13, except that it includes air-gaps 603 having a low optical index, which acts as a confinement barrier for the light within the Fabry-Perot cavities. As in FIG. 13, the reflective layer 218 forms the second reflective layer of the Fabry-Perot cavity type colour filters Fi obtained according to this step (here six filters F1 to F6). Each filter Fi is formed by a part of the first reflective layer 215, the dielectric pattern and a part of the reflective layer 218. Each filter Fi faces a corresponding transducer (that is, pixel).

By means of this third embodiment and the presence of the air-gaps 603, the problems of "crosstalk" previously mentioned are considerably limited when the dimensions of the Fabry-Perot cavities become in the order of the wavelength of the light, thus increasing the efficiency of the overall device. The air-gap encircling each Fabry-Perot cavity thus makes it possible to achieve a multispectral filtering device using Fabry-Perot cavities isolated from each other. It should be noted that beneficially, air-gaps can also surround the photoelectric transducers, which are also subject to the same crosstalk problems.

A fourth embodiment of the method according to an embodiment of the invention may consist in replacing the air-gaps by optical isolation walls, the walls being made of materials with a low optical refractive index, the walls surrounding the Fabry-Perot cavities so as to limit the "crosstalk" between them. It should be noted that this type of solution ("air-gap" or isolation wall) has already been implemented around the photoelectric transducers (photodiode) but not at the filter as provided in the present invention. Materials with an optical index between 1.25 and 1.4 (such as Low-n polymer SLS-B047A from the Fujifilm™ company having an index n=1.25 at 550 nm) may be used for the isolation wall materials. Beneficially, it is advisable to use a polymer which has an optical index between 1.25 and 1.4 (knowing that the average optical index of a polymer is in the order of 1.5). Usually, these are polymers having fluorinated groups. A large number of materials of this type already exist for optical applications. As examples of polymers with fluorinated groups, mention can be made of Poly(hexafluoropropylene oxide), Fluorinated Ethylene Propylene, Poly(tetrafluoroethylene) or Poly(octafluoropentyl acrylate). Mention can also be made of a few examples of non-fluorinated polymers such as Poly(methyl hydro siloxane) or Hydroxypropyl cellulose.

The method 700 according to this fourth embodiment is represented in [FIG. 40]. The first eight steps 701 to 709 are respectively identical to the first eight steps 501 to 509 of the previously described method 500.

Step 710 illustrated in [FIG. 41] consists in depositing or spreading a material 800 with a low optical index (that is, an optical index strictly lower than the optical index of the dielectric material of the layer 207 intended to form the Fabry-Perot cavity). The material 800 fills the gaps 603 previously created. It should be noted, as is the case in FIG. 41, that the filling by the material 800 may be done in excess above the surface formed by the resin patterns 204 and the encapsulation layer 205.

Step 711 illustrated in [FIG. 42] consists in planarising the surface by removing excess material 800 to leave the latter only in the gaps 603.

The top view in FIG. 42 shows the regular grid pattern of the gaps filled with the material 800, the parts of the dielectric layer 207 seen through the gaps 602 and the part of the encapsulation layer 205 corresponding to the resin pattern 204A1.

Steps 712, 713, 714, 715 and 716 are respectively identical to steps 106, 107, 108, 109 and 110 illustrated in FIGS. 8 to 12 and lead to the device illustrated in [FIG. 43]. This device is almost identical to the device in FIG. 39, except that the air-gaps are replaced by gaps filled with the material 800 having a lower optical index than the dielectric material used for the Fabry-Perot cavities and which acts as a confinement barrier for the light within the cavities. As in FIG. 39, the reflective layer 218 forms the second reflective layer of the Fabry-Perot cavity type colour filters Fi obtained according to this step (here six filters F1 to F6). Each filter Fi is formed by a part of the first reflective layer 215, the dielectric pattern and a part of the reflective layer 218. Each filter Fi faces a corresponding transducer (that is, pixel).

As mentioned previously, the presence of the walls of material 800 aims at enhancing the optical efficiency of the Fabry-Perot filtering cavities by integrating these optical isolation and confinement walls into each cavity.

It is noticed that in the previous embodiment, the isolation walls are made after the deposition of the dielectric material intended to form the core of the Fabry-Perot cavities. According to a fifth embodiment of the method according to the invention (method 900 in [FIG. 44]), it is also possible to begin by depositing the low optical index material and structuring it into isolation walls before making and structuring the dielectric material defining the Fabry-Perot cavities.

The first three steps 901, 902 and 903 of the method 900 are respectively identical to the steps 101, 102 and 103 of the method 100 illustrated in FIGS. 2, 3 and 5.

Step 904 illustrated in [FIG. 45] consists in depositing or spreading the material 718 with a low optical index (that is, with an optical index strictly lower than the optical index of the dielectric material intended to form the Fabry-Perot cavity and not yet deposited) on the encapsulation layer 205.

Step 904 is followed by step 905 illustrated in [FIG. 46] during which the layer 718 is planarised with a selective stop at the top of the encapsulation layer 205. This planarisation step can be carried out by an etch-back type etching step possibly followed by a CMP (Chemical Mechanical Polishing) step.

The method 900 then includes a step 906 illustrated in [FIG. 47] of depositing or spreading a layer of light- or electron-sensitive resin 719 above the planarised layer 718 with a low optical index material.

The next step 907 illustrated in [FIG. 48] aims at exposing the resin layer 719 to a photolithography system to structure a grid-like array of lines 720 after development of the resin, the lines being vertically aligned with the edges or flanks of the future Fabry-Perot cavities (here, the lines are aligned with the flanks of the encapsulation layer 205).

The method 900 then includes a step 908 illustrated in [FIG. 49] in which a dry or wet etch of the planarised layer 718 of low optical index material is carried out by transferring the previously made lines 720 of resin into the layer 718. This forms a grid of lines 721 of the low optical index material identical to the resin grid obtained at the end of step 907.

It should be noted that the dimension (width) of the lines forming the isolation walls, thus transferred into the low optical index material, can be taken into account, if necessary, in the lateral dimensioning (overall size) of the Fabry-Perot cavities.

The following steps 909, 910, 911, 912, 913, 914, 915 and 916 of the method 900 are identical to the steps 104, 105, 106, 107, 108, 109, 110 and 111 of the method 100 according to the invention and result in a device such as that illustrated in FIG. 43.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

It will be appreciated that the various embodiments described previously are combinable according to any technically permissible combinations.

The invention claimed is:

1. A method for manufacturing a multispectral filter for electromagnetic radiation, said multispectral filter including at least two color filters, each filter including a first reflective layer, a second reflective layer, and a layer of dielectric material of Fabry-Perot cavity between the first reflective layer and the second reflective layer, a thickness of the dielectric layer of the two color filters being different and each of the two color filters facing a photoelectric transducer, said method comprising:
depositing a resin layer on a handle substrate;
three-dimensionally structuring the resin layer by lithography so as to obtain at least two resin patterns of different heights, at least one of the patterns having a maximum reference height, the maximum reference height being measured perpendicularly to a plane of the handle substrate;
depositing a layer made of the dielectric material to form the dielectric patterns of the Fabry-Perot cavities, said layer of dielectric material covering the at least two resin patterns by having an upper surface, each point of which is located at a height relative to the handle substrate greater than the maximum reference height;
planarizing by removal of the dielectric material with a selective stop at a top of highest resin pattern;
transferring the planarized face of the handle substrate to an upper face of a carrier substrate, including at least two photoelectric transducers, each of said at least two resin patterns facing a photoelectric transducer, a reflective layer intended to form the first reflective layer of the two color filters being positioned at a transfer interface between the handle substrate and the carrier substrate;
removing the handle substrate;
removing the resin so as to release at least two dielectric patterns of Fabry-Perot cavities of different thicknesses on the surface, and
depositing a reflective layer onto the at least two dielectric patterns of Fabry-Perot cavities, forming the second reflective layer of the two color filters.

2. The method according to claim 1, wherein the three-dimensionally structuring is followed, prior to depositing the layer made of the dielectric material to form the dielectric patterns of the Fabry-Perot cavities, by a step of conformally depositing an encapsulation layer onto the at least two resin patterns.

3. The method according to claim 1, wherein the lithography used for the three-dimensionally structuring is a grayscale lithography.

4. The method according to claim 1, wherein the reflective layer to form the first reflective layer of the two color filters is previously deposited onto the carrier substrate above the photoelectric transducers.

5. The method according to claim 4, wherein a layer of dielectric material is deposited onto said reflective layer of the carrier substrate so as to ensure a dielectric/dielectric contact when transferring the planarized face of the handle substrate to the upper face of the carrier substrate.

6. The method according to claim 1, further comprising making alignment marks, said alignment marks being made in the handle substrate or in the resin layer, alignment marks also being present in the carrier substrate so as to ensure that each of the at least two resin patterns faces a photoelectric transducer.

7. The method according to claim 1, further comprising depositing a barrier layer prior to the step of depositing the resin layer, the removal of the handle substrate stopping on said barrier layer and being followed by the removal of the barrier layer so as to release the structured resin layer on the surface.

8. The method according to claim 1, further comprising making air walls separating the dielectric patterns of Fabry-Perot cavities.

9. The method according to claim 1, further comprising making walls of material having an optical refractive index strictly lower than a refractive index of the dielectric material intended to form the dielectric patterns of the Fabry-Perot cavities, said walls separating the dielectric patterns of the Fabry-Perot cavities.

10. The method according to claim 1, further comprising, in addition to making at least two color filters, each filter including a first reflective layer, a second reflective layer, a layer of dielectric material of Fabry-Perot cavity between the first reflective layer and the second reflective layer, making at least one other color filter including a first reflective layer, a second reflective layer, a layer of dielectric material of a Fabry-Perot cavity, called of a second type, between the first reflective layer and the second reflective layer, the dielectric material of this other color filter being different from the dielectric material of both color filters.

11. The method according to claim 10, wherein said three-dimensionally structuring the resin layer by lithography is carried out so as to obtain a free location in which the dielectric material intended to form the pattern of the Fabry-Perot cavity of a second type is deposited.

* * * * *